United States Patent
Loechelt et al.

(10) Patent No.: US 11,411,077 B2
(45) Date of Patent: Aug. 9, 2022

(54) ELECTRONIC DEVICE INCLUDING DOPED REGIONS AND A TRENCH BETWEEN THE DOPED REGIONS

(71) Applicant: Semiconductor Components Industries, LLC, Phoenix, AZ (US)

(72) Inventors: Gary Horst Loechelt, Tempe, AZ (US); Balaji Padmanabhan, Chandler, AZ (US); Dean E. Probst, West Jordan, UT (US); Tirthajyoti Sarkar, Fremont, CA (US); Prasad Venkatraman, Gilbert, AZ (US); Muh-Ling Ger, Chandler, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/016,708

(22) Filed: Sep. 10, 2020

(65) Prior Publication Data
US 2022/0077282 A1    Mar. 10, 2022

(51) Int. Cl.
*H01L 29/06* (2006.01)
*H01L 29/78* (2006.01)

(52) U.S. Cl.
CPC ...... *H01L 29/0638* (2013.01); *H01L 29/7813* (2013.01)

(58) Field of Classification Search
CPC ............. H01L 29/0638; H01L 29/7813; H01L 29/1095; H01L 29/7375; H01L 29/7397; H01L 29/66325; H01L 29/66333–66348; H01L 27/0705; H01L 29/407; H01L 29/7803; H01L 29/41766
See application file for complete search history.

(56) References Cited

U.S. PATENT DOCUMENTS

| | | | |
|---|---|---|---|
| 9,466,708 | B2 | 10/2016 | Padmanabhan et al. |
| 9,799,646 | B2 | 10/2017 | Liu et al. |
| 9,882,020 | B2 | 1/2018 | Padmanabhan et al. |
| 10,164,091 | B1 | 12/2018 | Loechelt |
| 2003/0047777 | A1 | 3/2003 | In't Zandt et al. |
| 2010/0006979 | A1 | 1/2010 | Krutsick |
| 2011/0303925 | A1* | 12/2011 | Nishimura .......... H01L 29/7813 257/77 |
| 2013/0088280 | A1 | 4/2013 | Lal et al. |
| 2013/0207172 | A1* | 8/2013 | Hsieh .................. H01L 29/7809 438/270 |
| 2015/0137225 | A1 | 5/2015 | Lui et al. |
| 2017/0194486 | A1 | 7/2017 | Venkatraman et al. |
| 2020/0098857 | A1 | 3/2020 | Loechelt et al. |

* cited by examiner

*Primary Examiner* — Cuong B Nguyen
(74) *Attorney, Agent, or Firm* — Abel Schillinger, LLP

(57) ABSTRACT

An electronic device can include doped regions and a trench disposed between the doped regions, wherein the trench can include a conductive member. In an embodiment, a parasitic transistor can include doped regions as drain/source regions and the conductive member as a gate electrode. A semiconductor material can lie along a bottom or sidewall of the trench and be a channel region of the parasitic transistor. The voltage on the gate electrode or the dopant concentration can be selected so that the channel region does not reach inversion during the normal operation of the electronic device.

20 Claims, 21 Drawing Sheets

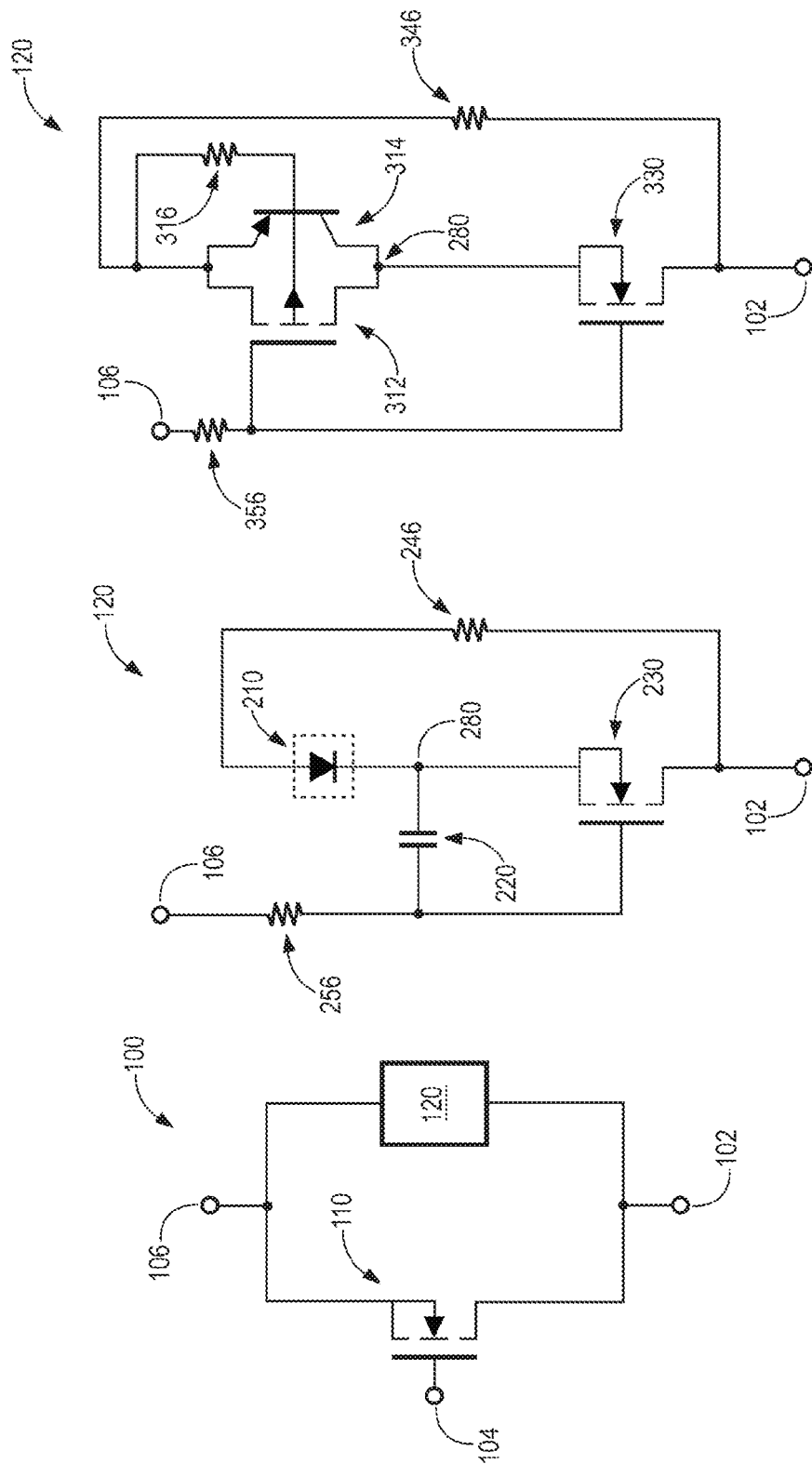

ELECTRONIC DEVICE INCLUDING DOPED REGIONS AND A TRENCH BETWEEN THE DOPED REGIONS

FIELD OF THE DISCLOSURE

The present disclosure relates to electronic devices including doped regions and trenches between the doped regions.

RELATED ART

A power insulated-gate field-effect transistor (IGFET) can suffer from ringing during switching. The ringing may be aggravated by interaction of inductance associated with a package and circuit board along with a non-linear output capacitance of the power IGFET. The problem may be worse in newer technologies because the desire to improve efficiency requires faster switching speeds and lower on-state resistance that often results in worse capacitance characteristics. Modern shielded-gate IGFETs can include an integrated snubber structure; however, existing integrated snubber structures may be insufficient to keep pace with the advances in newer power IGFET technologies. New designs made by modifying a prior design may cause isolation between areas or components to be generated or revised. Further improvements of the performance and isolation within electronic devices are desired.

BRIEF DESCRIPTION OF THE DRAWINGS

Embodiments are illustrated by way of example and are not limited in the accompanying figures.

FIG. 1 includes a schematic drawing of a circuit that includes a transistor and a charge storage component.

FIG. 2 includes a schematic drawing of a simplified circuit for the charge storage component in FIG. 1.

FIG. 3 includes a schematic drawing of a more detailed embodiment for the charge storage component in FIG. 1, in accordance with a first set of embodiments.

Figure 4:
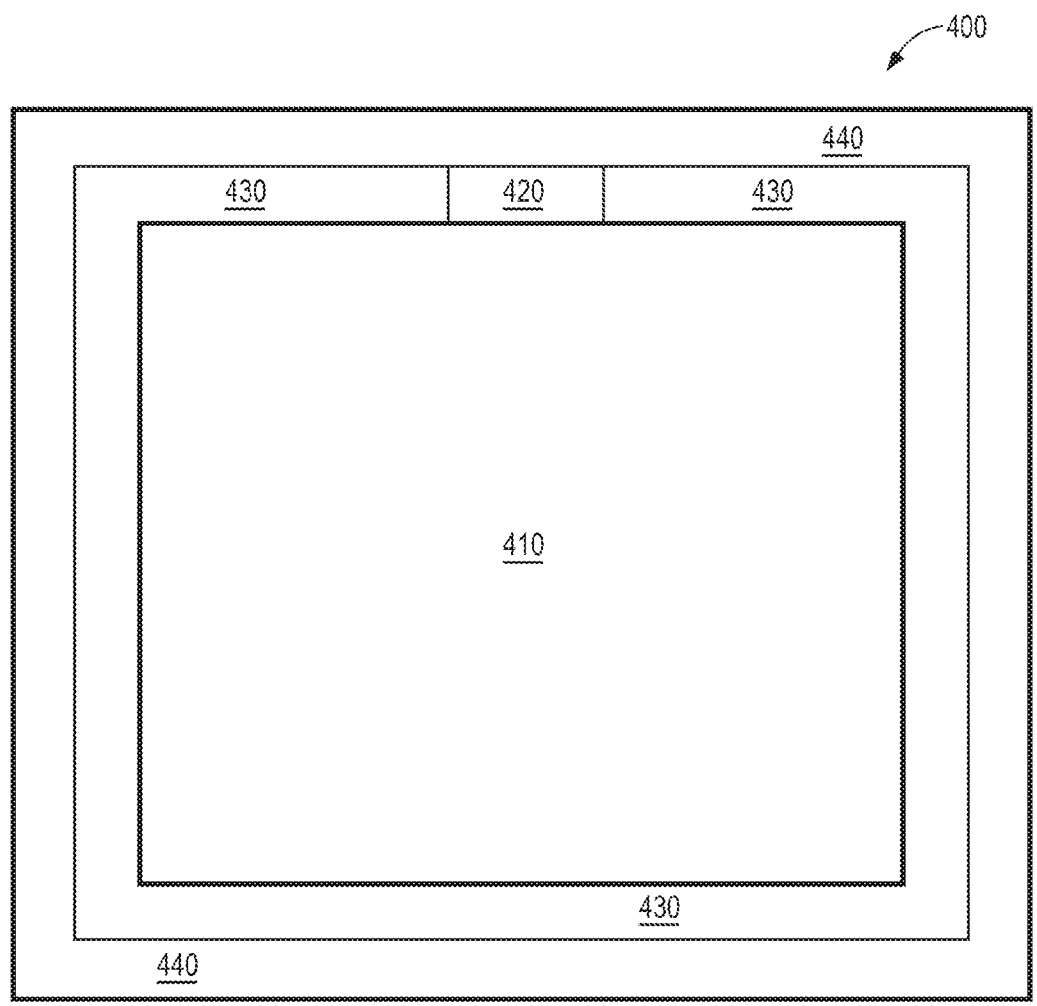
FIG. 4 includes an illustration of a top view of a die that includes the electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

The term "active transistor" is intended to mean a transistor of an electronic device, where such transistor is designed to allow current to flow through the active region of such transistor during at least a portion of time during the normal operation of the electronic device. An active transistor may be configured to act as a switch, that is, can be turned on and off, or may be configured to not act as a switch during the normal operation of the electronic device. An example of the latter can be a high-side transistor in a cascode circuit, where the gate of the high-side transistor is coupled to a source of the low-side transistor in a cascode circuit. Compare to parasitic transistor defined later in this specification.

A border between a more heavily doped region or layer and an immediately adjacent and more lightly doped region or layer of the same conductivity type is where the dopant concentration of the more lightly doped region or layer is 1.1 times higher than the difference between the peak dopant concentration of the more heavily doped region and the average dopant concentration of such more lightly doped region or layer.

The term "electrically coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be partially or completely transferred from one to another. A subset of "electrically coupled" can include an electrical connection between two electronic components. In a circuit diagram, a node corresponds to an electrical connection between the electronic components. Thus, an electrical connection is a specific type of electrical coupling; however, not all electrical couplings are electrical connections. Other types of electrical coupling include capacitive coupling, resistive coupling, and inductive coupling.

The term "heavily doped," with respect to a layer or region, is intended to mean a dopant concentration of at least $1 \times 10^{18}/cm^3$.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "power transistor" is intended to mean a transistor that has a product of a drain-to-source voltage ($V_{DS}$) when the transistor is in an off-state times drain current ($I_D$) when the transistor is in an on-state is at least 11 W. For example, a transistor may have $V_{DS}$ of 40 V when in the off-state and have $I_D$ of 12 A when in the on-state. Such a transistor is a power transistor because the product of 40 V×12 A is 480 W.

Unless explicitly stated to the contrary, the terms "horizontal," "lateral," and their variants are in a direction parallel to a primary surface of a substrate or semiconductor layer or region, and the terms "vertical" and its variants are in a directions perpendicular to a primary surface of a substrate or a semiconductor layer or region. For example, two features may be laterally offset and may or may not lie at different elevations. Thus, a lateral offset may be seen with a top view of plan view of an electronic device.

The term "parasitic transistor" is intended to mean an undesired transistor that is present or formed as a consequence of physical design of an electronic device. Sustained or continuous current, aside from low-level leakage, for example, $1 \times 10^{-6}$ A or less, does not flow through an active region of the parasitic transistor during the normal operation of the electronic device.

The term "voltage rating," with reference to an electronic device, means a nominal voltage that the electronic device is designed to operate. For example, a transistor with a voltage rating of 50 V is designed for a 50 V difference between drain and source regions or electrodes or collector and emitter regions or electrodes when the transistor is in an off-state. The transistor may be able to withstand a higher voltage, such as 60 V or 70 V, for a limited duration, such as during and shortly after a switching operation, without significantly permanently damaging the transistor. Such information may be obtained when referring to voltage connections for the electronic device that appear in a product data sheet for the electronic device.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described. When values of a parameter are significantly different, such values are more than 10% different (and more than 20% different for semiconductor doping concentrations). When values of a parameter are different (e.g., less than, greater than, a numerical difference between values, or the like), without being modified by significantly or insignificantly, any difference beyond manufacturing tolerances for commercial production are considered different.

Group numbers correspond to columns within the Periodic Table of Elements based on the IUPAC Periodic Table of Elements, version dated Dec. 1, 2018.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Two doped regions of the same conductivity type separated by a trench structure can be designed to keep leakage current between two doped regions acceptably low. In an embodiment, a conductive member can repel charge carriers associated with the conductivity type of majority carriers within the doped regions. For example, when the doped regions are p-type, the charge carriers are holes, and the conductive member can be at a voltage to repel holes from the trench structure. When the doped regions are n-type, the charge carriers are electrons, and the conductive member can be at a voltage to repel electrons from the trench structure. In another embodiment, a relatively high dopant concentration of semiconductor material at the bottom or sidewall of the trench can be selected to keep leakage current low (at most $1\times10^{-6}$ A or at most $1\times10^{-9}$ A) during the normal operation of the electronic device. The physical structure can be leveraged using an existing process flow without any additional mask or at most only one additional mask.

In an aspect, an electronic device can include a substrate including a semiconductor region having a primary surface, wherein the substrate defines a trench extending into the semiconductor region; a conductive member within the trench; a first doped region having a first conductivity type; a second doped region having the first conductivity type; a semiconductor material having a second conductivity type opposite the first conductivity type, wherein the semiconductor material lies along a bottom or a sidewall of the trench; a first power supply terminal electrically coupled to the first doped region and the conductive member; and a second power supply terminal electrically coupled to the second doped region. The trench can be disposed between the first doped region and the second doped region, and at least one of the first doped region and the second doped region lies at an elevation higher than a bottom of the trench. The electronic device can be configured such that (1) when the first conductivity type is p-type, the first power supply terminal is associated with a higher voltage as compared to the second power supply terminal, or (2) when the first conductivity type is n-type, the first power supply terminal is associated with a lower voltage as compared to the second power supply terminal.

In another aspect, an electronic device can include a substrate including a semiconductor region having a primary surface, wherein the substrate defines a trench extending at least partly through the semiconductor region, the trench has a bottom, a first side, and a second side opposite the first side, and the semiconductor region has a background dopant concentration. The electronic device can further include a first doped region having a first conductivity type; a second doped region having the first conductivity type; and a third doped region having the second conductivity type opposite the first conductivity type. The third doped region can be adjacent to the bottom, the first side, or the second side of the trench, and a dopant concentration of the doped region is at least 2 times the background dopant concentration. The electronic device can also include a first terminal electrically coupled to the first doped region, wherein the first terminal is associated with a first voltage; and a second terminal electrically coupled to the second doped region, wherein the second terminal is associated with a second voltage that is different from the first voltage. The trench can be disposed between the first doped region and the second doped region.

In a further aspect, an electronic device can include a parasitic IGFET. The parasitic IGFET can include a substrate including a semiconductor region having a primary surface, wherein the substrate defines a trench extending at least partly through the semiconductor region, and the trench has a bottom, a first side, and a second side opposite the first side; a source region that is closer to the first side of the trench than to the second side of the trench, wherein the source region has a first conductivity type; a drain region that is closer to the second side of the trench than to the first side of the trench, wherein the drain region has the first conductivity type; a channel region disposed at the bottom, the first side, or the second side of the trench, wherein the channel region has a second conductivity type opposite the first conductivity type; and a gate electrode disposed within the trench. The electronic device can also include a first terminal electrically coupled to the source region, wherein the first terminal is associated with a first voltage; and a second terminal electrically coupled to the drain region, wherein the second terminal is associated with a second voltage that is different from the first voltage. The trench can be disposed between the source region and the drain region, and a dopant concentration of the channel region can be sufficient to prevent inversion of the channel region during normal operation of the electronic device.

FIG. 1 includes a diagram of a circuit 100 that can be used for an electronic device. The circuit 100 includes a transistor 110 and a charge storage component 120. A drain terminal 102 is electrically coupled to a drain of the transistor 110, a gate terminal 104 is electrically coupled to a gate of the transistor 110, and a source terminal 106 is electrically coupled to a source of the transistor 110. In an embodiment, the transistor 110 can be a power transistor including a plurality of transistor structures where drain regions of the transistor structures are electrically connected to one another, gate electrodes of the transistor structures are electrically connected to one another, and source regions of the transistor structures are electrically connected to one another. The transistor 110 can include hundreds, thousands or more of the transistor structures. The transistor structures can include n-channel insulated-gate field-effect transistor (IGFET) structures. The transistor 110 can be an active transistor.

The charge storage component 120 affects the output capacitance ($C_{OSS}$) of the electronic device. The charge storage component 120 can be configured to behave less like a linear capacitor. Furthermore, the charge storage component can also be configured to have a retrograde capacitance characteristic with respects to voltage. As used herein, a linear capacitor has a constant capacitance value as a function of applied voltage. Conversely, a non-linear capacitor has a non-constant or variable capacitance value as a function of applied voltage. If a non-linear capacitor has a monotonically decreasing capacitance value with respects to applied voltage, it is considered to be prograde. If, on the other hand, a non-linear capacitor has a capacitance value which increases with respects to applied voltage, it is considered to be retrograde, even if the increase in capacitance value is not monotonic over the entire operating range of voltage. Most modern power transistors have strongly prograde, non-linear output capacitance characteristics. The charge storage component 120 can provide small-signal $C_{OSS}$, dynamic $C_{OSS}$, or both that can help the transistor 110 with respect to high speed switching operations. For power conversion applications, switching frequencies are typically in the range of hundreds of kilohertz to a few megahertz. However, since the resulting waveform is often closer in shape to a square wave than a sine wave, the leading and falling edges of the transition are effectively at a higher frequency, with rise and fall times of approximately a few nanoseconds. The charge storage component 120 has a terminal coupled to the drain of the transistor 110 and the drain terminal 102 and another terminal coupled to source of the transistor 110 and the source terminal 106. The designs as described herein are well suited to a transistor, such as the transistor 110, having a voltage rating in a range from 20 V to 80 V. If needed or desired, the voltage rating of the transistor may be lower than 20 V or higher than 80 V.

FIG. 2 provides a simplified diagram of a circuit that can be useful for understanding basic concepts of the charge storage component 120 in accordance with an embodiment. The charge storage component 120 includes a component 210, a charge storage element 220, and a transistor 230. The component 210 includes a pn junction that is represented by a diode in FIG. 2. Alternatively, the pn junction can be part of a transistor that will be described later in this specification. A p-type region of the component 210 is coupled to a current-carrying electrode of the transistor 230. At a node 280, the n-type region of the component 210 is coupled to an electrode of the charge storage element 220 and the other current-carrying electrode of the transistor 230. The control electrode of the transistor 230 is coupled to the other electrode of the charge storage element 220. The transistor 230 can be configured to accumulate and dissipate charge similar to the charge storage element 220 in FIG. 2.

The component 210 can be a diode (as illustrated in FIG. 2), a pnp bipolar transistor (illustrated in later figures), or a p-channel IGFET (illustrated in later figures), as each has a pn junction. The transistor 230 can be an n-channel IGFET, as illustrated in FIG. 2, or an npn bipolar transistor. An anode (diode), an emitter region (pnp bipolar transistor), or a source region (p-channel IGFET) of the component 210 is coupled to a drain region of the n-channel IGFET. One of the electrodes of the charge storage element 220; a cathode (diode), a collector region (pnp bipolar transistor), or a drain region (p-channel IGFET) of the component 210; and a source region of the n-channel IGFET are coupled to one another at the node 280. The charge storage element 220 may be a separate electronic component from the component 210 or can include an active region of a transistor when the component 210 is an IGFET or bipolar transistor. In the embodiment as illustrated in FIG. 2, electrical couplings can be in the form of electrical connections or may be resistive couplings, such as illustrated with resistors 246 and 256.

First Set of Embodiments

FIG. 3 includes a circuit diagram in accordance with a first set of embodiments. FIG. 3 includes more details for the charge storage component 120. Referring to FIGS. 2 and 3, the combination of the component 210 and the charge storage element 220 corresponds to a p-channel IGFET 312, a pnp bipolar transistor 314, and a resistor 316. The resistor 316 corresponds to the emitter-to-base resistance of the pnp bipolar transistor 314. The transistor 230 includes an n-channel IGFET 330. In a particular embodiment, the n-channel IGFET 330 is a depletion-mode n-channel IGFET. In FIG. 3, a source region of the p-channel IGFET 312, an emitter region of the pnp bipolar transistor 314, and a terminal of the resistor 316 are electrically coupled to one another. The other terminal of the resistor 316 is coupled to a base region of the pnp bipolar transistor 314. A drain region of the p-channel IGFET 312, a collector region of the pnp bipolar transistor 314, and a source region of the n-channel IGFET 330 are electrically coupled to one another at node 280. A gate electrode of the p-channel IGFET 312 and a gate electrode of the n-channel IGFET 330 are coupled to each other. Within this paragraph, each of the electrical couplings can be in the form of electrical connections.

In the embodiment of FIG. 3, charge can be stored by the IGFETs 312 and 330. The gate electrodes of the IGFETs 312 and 330 form an electrode of the charge storage component 120, and active regions of the IGFETs 312 and 330 and the pnp bipolar transistor 314 form the other electrode of the charge storage component 120.

The gate electrode of the p-channel IGFET 312 and the gate electrode of the n-channel IGFET 330 can be electrically coupled to the source terminal 106 via a conduction path that includes a resistor 356. The drain terminal 102 is coupled to the drain of the n-channel IGFET 330. The drain terminal 102 is also coupled to the source of the p-channel IGFET 312 and the emitter of the pnp bipolar transistor 314 via a conduction path that includes a resistor 346. In an embodiment, the resistors 346 and 356 can include a doped semiconductor material. Particular values for the resistors 346 and 356 may depend on the dopant concentration and the layout for the physical structures, as are described below in more detail. The values for these resistors, and for resistor 316, depend upon the desired frequency response for the charge storage component 120. As illustrated in subsequent figures, possible values for the capacitance of the charge storage component can range from approximately 4000 pF to over 20000 pF. In order for the charge storage component to have an RC response time on the order of 1 nanosecond, which is a typical voltage rise and fall time for many power switching applications, these resistances can be 0.25 Ohms, 0.05 Ohms, or less. The value of these resistors can be increased or decreased accordingly depending upon the capacitance value of the charge storage component and the desired frequency response.

FIG. 4 includes a top view of a die 400 that includes the electronic device. The die 400 includes an active area 410, a peripheral area 440, and a termination area 430 between the active area 410 and peripheral area 440. The active area 410 corresponds to the transistor 110 in FIG. 1. A charge storage area 420 corresponds to the charge storage component 120 in FIG. 1. In the embodiment as illustrated in FIG.

4, the charge storage area 420 may replace part of the termination area 430 and be located between portions of the active area 410 and the peripheral area 440 so that none of the charge storage area 420 replaces any of the active area 410. In another embodiment, a portion of the active area 410 can be replaced by the charge storage area 420 if needed or desired for a particular application.

Figure 5:
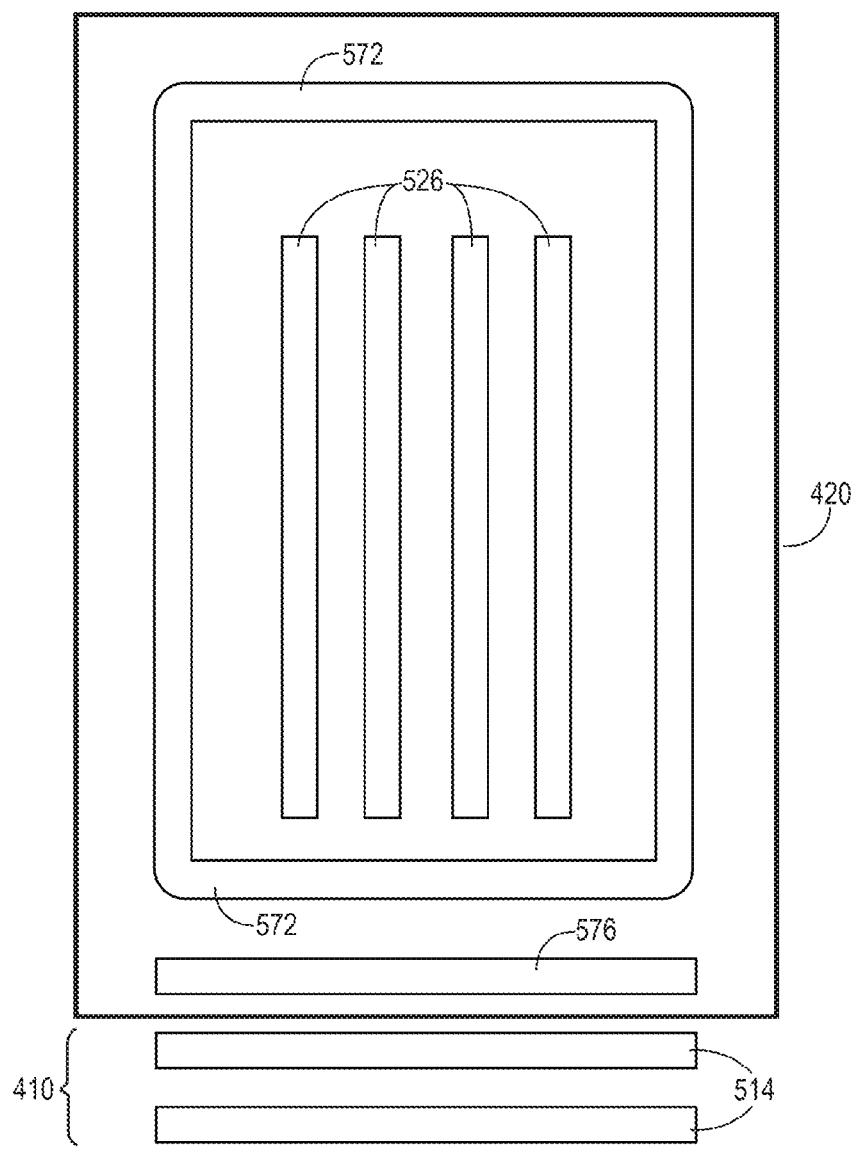
FIG. 5 includes an illustration of a top view of a portion of a workpiece that includes trenches within a charge storage area and a portion of an active area, wherein the charge storage area corresponds to the circuit of FIG. 3.

FIG. 5 includes a top down view of a portion of the active area 410 and the charge storage area 420. The physical embodiment of FIG. 5 is based on the circuits in FIGS. 1 and 3. A portion of the active area 410 is included in FIG. 5 to improve understanding of how the charge storage component 120 and transistor structures of the transistor 110 are integrated into the die 400. FIG. 5 illustrates trenches 514, 526, and isolation trenches 572 and 576 that extend at least partly through a semiconductor region. As will become more apparent in cross-sectional views later in this specification, each of the trenches includes a conductive member and an insulating layer disposed between the conductive member and a bottom and sidewalls of such trench. The trenches 514 correspond to trenches for gate electrodes, and in this embodiment, shield electrodes for the transistor structures of the transistor 110. The trenches 526 are within the charge storage area 420 and include one set of electrodes for the charge storage component within the charge storage area 420. The isolation trench 572 is an isolation trench within the charge storage area 420 and helps to isolate a doped region within the charge storage component area 420 from a doped region within the active area 410. More details regarding design considerations for the isolation trench 572 are described later in this specification. The isolation trench 576 helps in controlling the electric fields near the active area 410.

Figure 6:
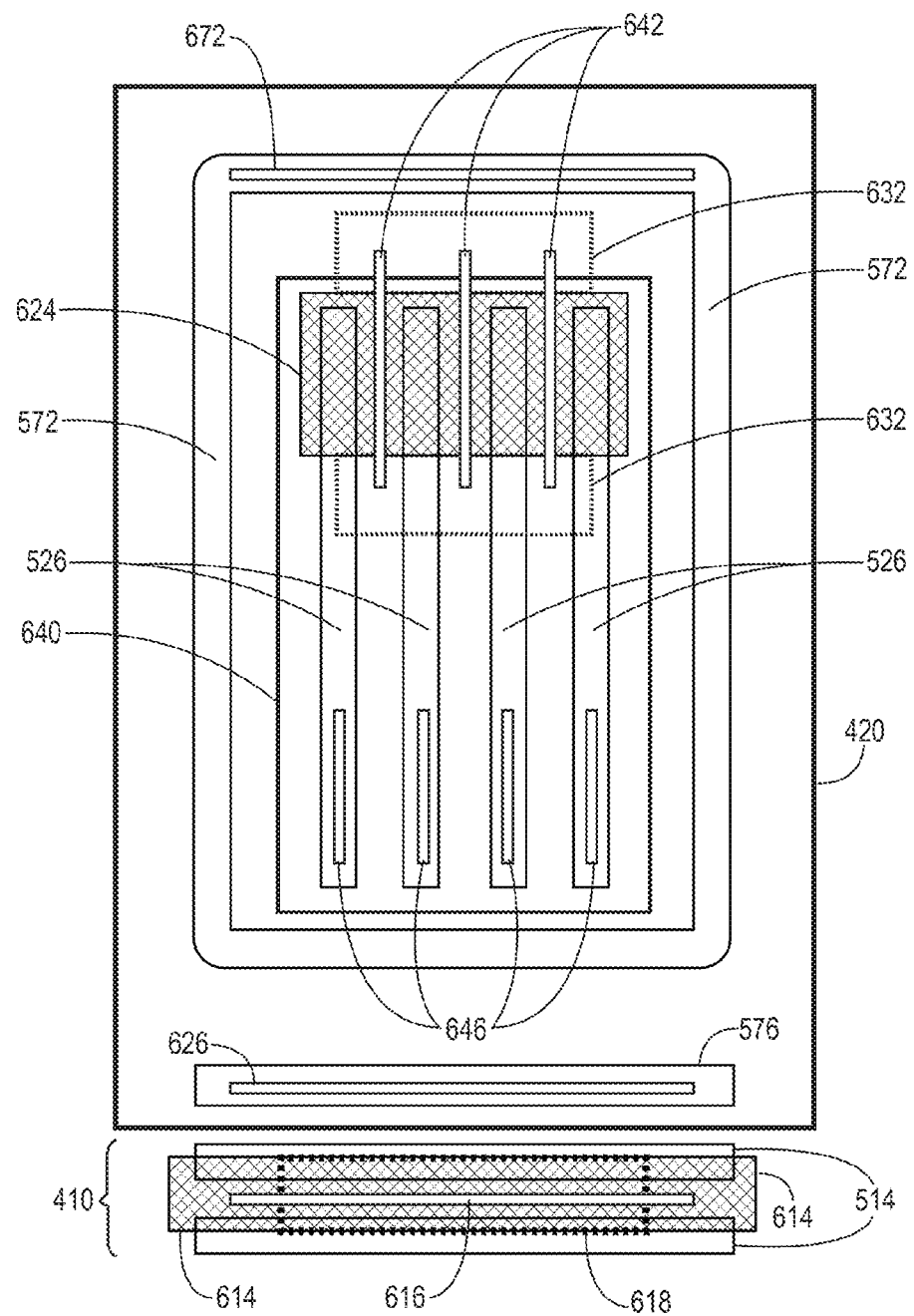
FIG. 6 includes an illustration of a top view of lithographic patterns for doped regions and contact openings for the workpiece of FIG. 5.

FIG. 6 includes the features described with respect to FIG. 5 and further includes lithographic patterns that can be used to selectively dope portions of the workpiece and to make contacts for the electronic device. Opening 640 corresponds to an opening within a mask where dopant for a compensation implant, a barrier doped implant, or both may enter the workpiece. The remainder of the mask can block dopant from entering other parts of the workpiece. Although illustrated with a single opening, the compensation implant and barrier inversion implant can be formed using different masks having openings of different sizes or shapes. Openings 614 and 624 correspond to openings within a mask where a dopant for a p-type body implant and p-well implant may enter the workpiece. Openings 618 and 632 correspond to openings within a mask where a source implant may enter the workpiece.

Contact openings 616, 626, 642, 646, and 672 correspond to contact openings that extend through an interlevel dielectric (ILD) layer (not illustrated in FIG. 6). The openings 616, 626, 642, 646, and 672 extend to a depth deeper than the source regions. Bottoms of the contact openings 616 and 642 receive a body contact implant, and bottoms of the openings 626, 646, and 672 may or may not receive the body contact implant. The contact opening 616 extends to a top of a pillar that includes the active region of a transistor structure for the transistor 110. The contact opening 626 extends to the conductive member within the trench 576. The contact openings 642 extend to and span portions of pillars between trenches 526 within the charge storage area 420. The contact openings 646 make contact to conductive members within the trenches 526 within the charge storage area 420. The contact opening 672 makes contact to the conductive member within the isolation trench 572. The contact openings 616, 626, 642, 646, and 672 may be filled with conductive plugs. A conductive plug is a type of a conductive member. In an alternative embodiment, the conductive plugs may not be used, and source and drain interconnects can contact regions along sidewalls and bottoms of the contact openings 616, 626, 642, 646, and 672.

Figure 7:
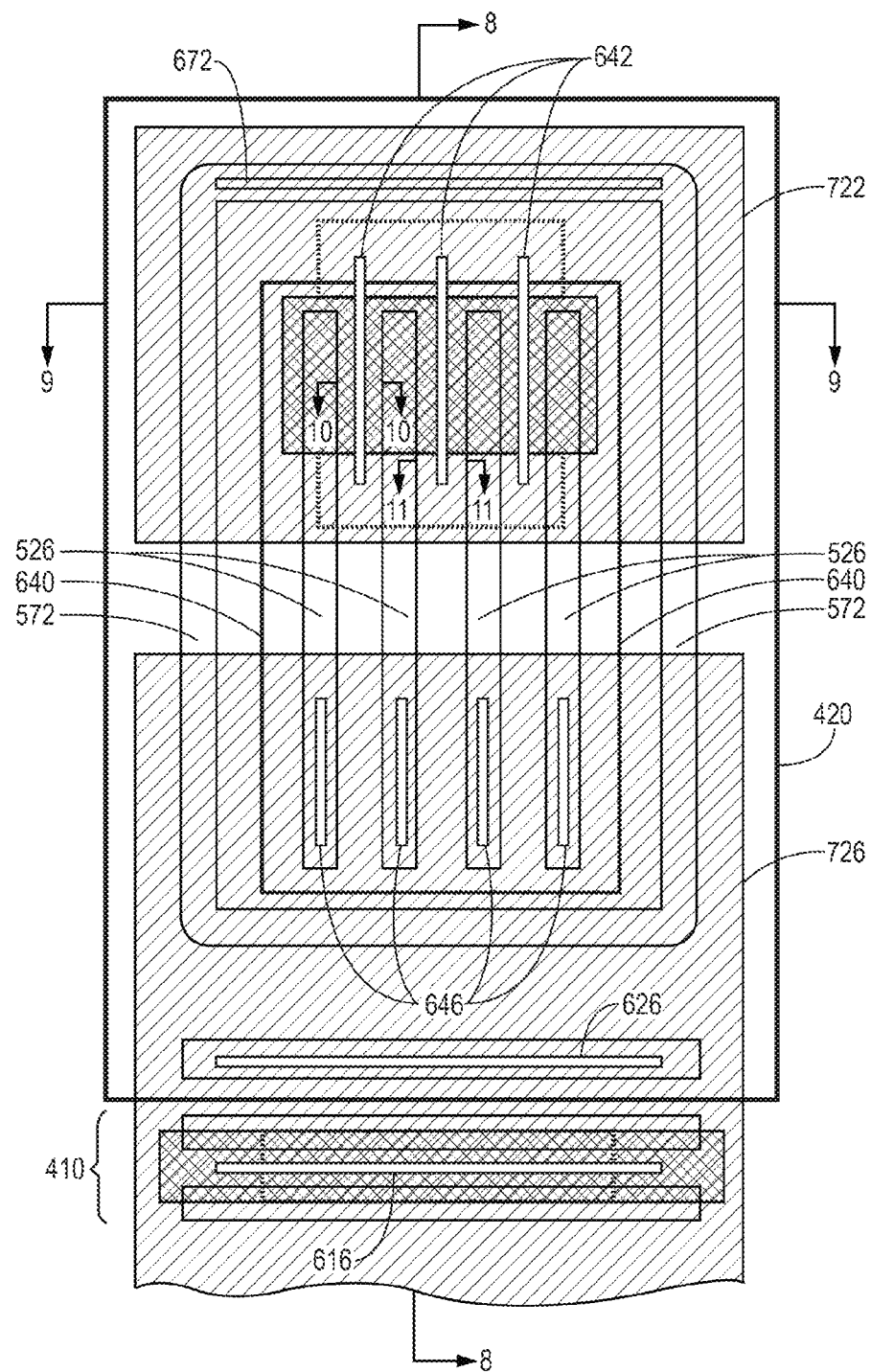
FIG. 7 includes an illustration of a top view of lithographic patterns for source and drain interconnects for the workpiece of FIG. 6.

FIG. 7 includes the features described with respect to FIGS. 5 and 6 and further includes lithographic patterns that can be used for source and drain interconnects. A drain interconnect 722 and a source interconnect 726 overlie the ILD layer. When conductive plugs are formed within the contact openings 616, 626, 642, 646, and 672, the drain interconnect 722 contacts conductive plugs within the contact openings 642 and 672, and the source interconnect 726 contacts conductive plugs within the contact openings 616, 626, and 646. When conductive plugs are not used, the drain interconnect 722 extends into the contact openings 642 and 672, and the source interconnect 726 extends into the contact openings 616, 626, and 646.

Figure 8:
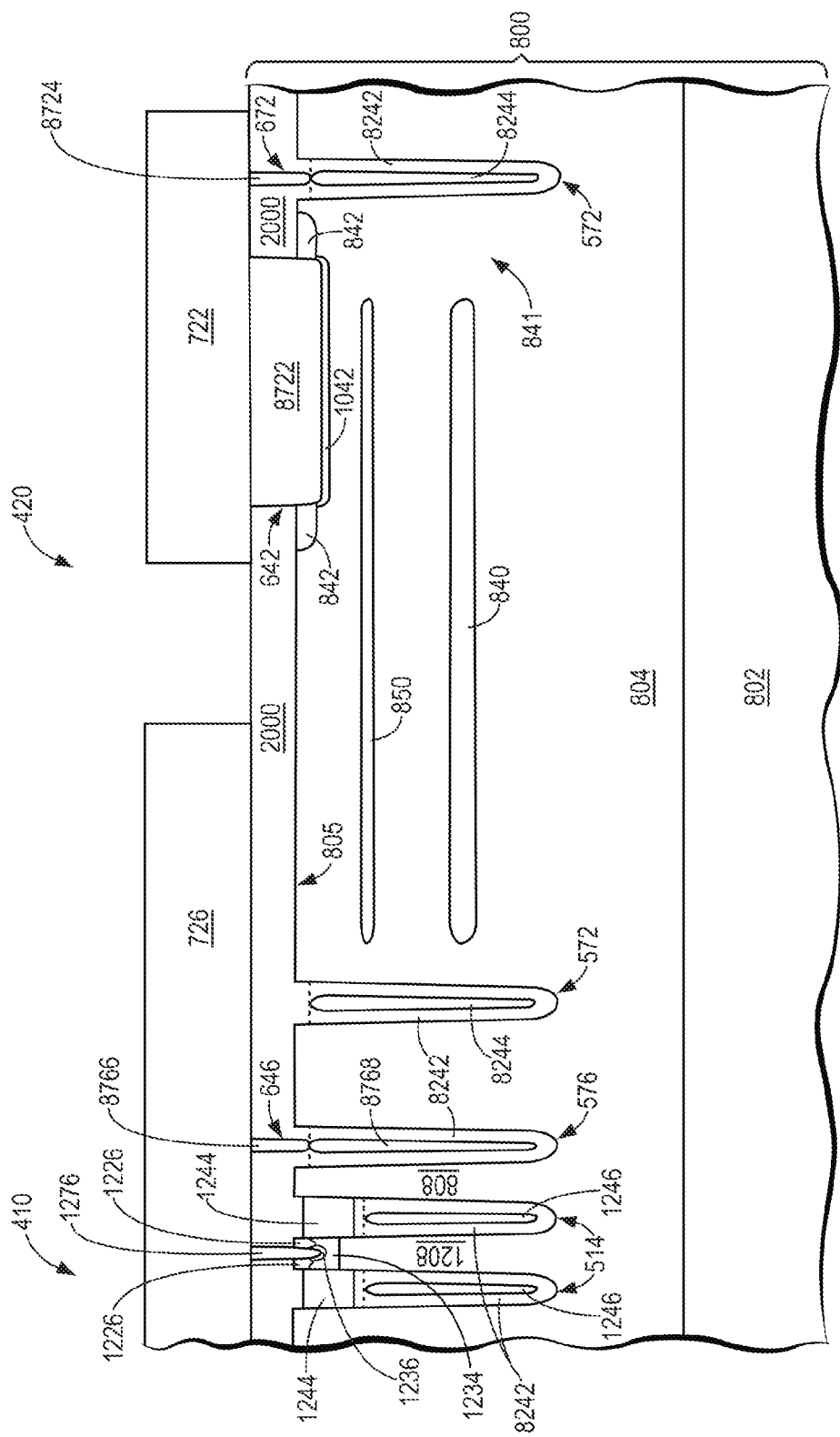
FIG. 8 includes an illustration of a cross-sectional view of the workpiece along sectioning line 8-8 in FIG. 7.
Figure 9:
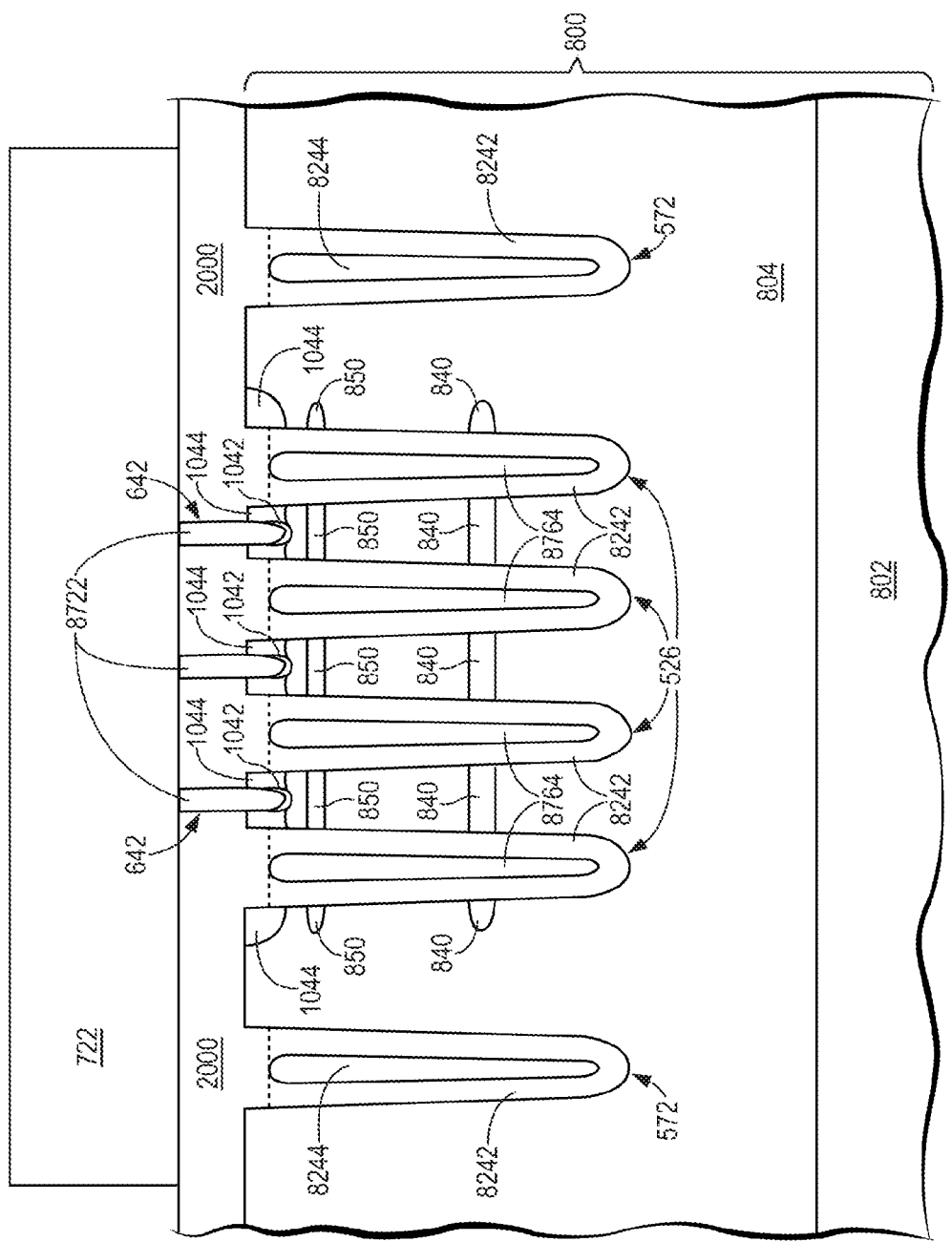
FIG. 9 includes an illustration of a cross-sectional view of the workpiece along sectioning line 9-9 in FIG. 7.
Figure 10:
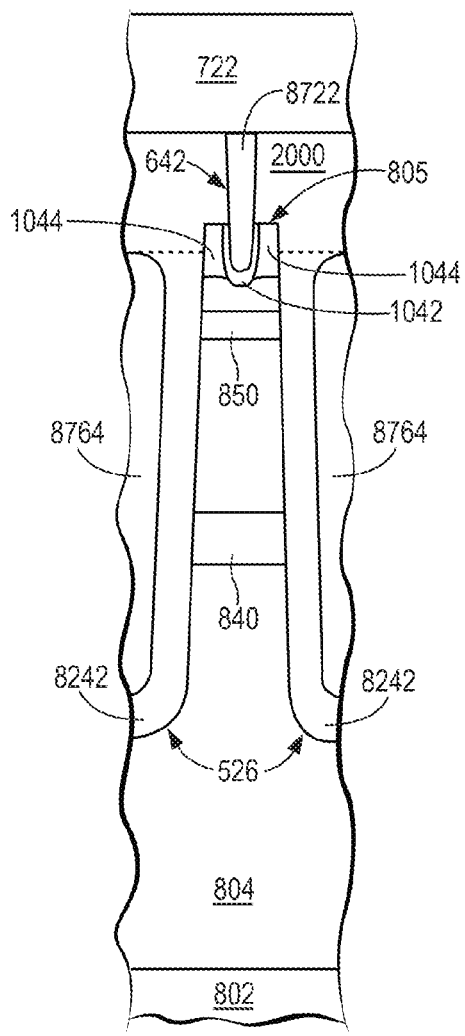
FIG. 10 includes an illustration of a cross-sectional view of the workpiece along sectioning line 10-10 in FIG. 7.
Figure 11:
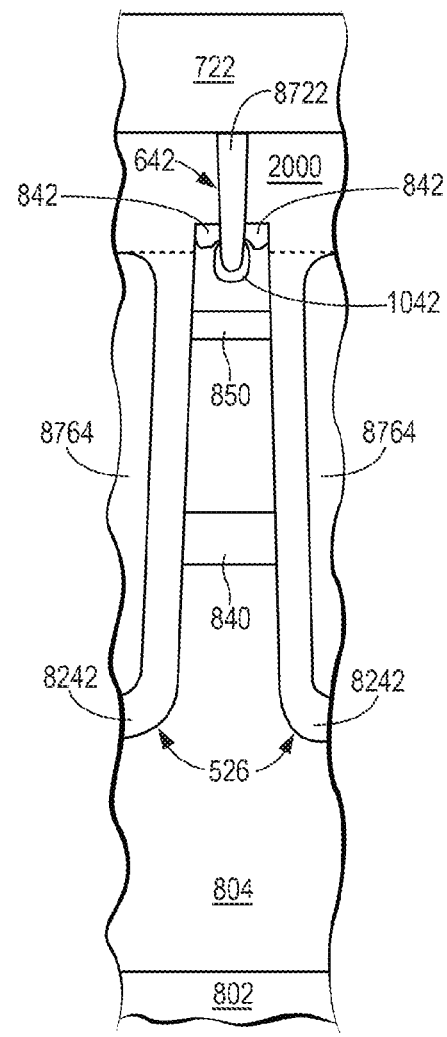
FIG. 11 includes an illustration of a cross-sectional view of the workpiece along sectioning line 11-11 in FIG. 7.
Figure 12:
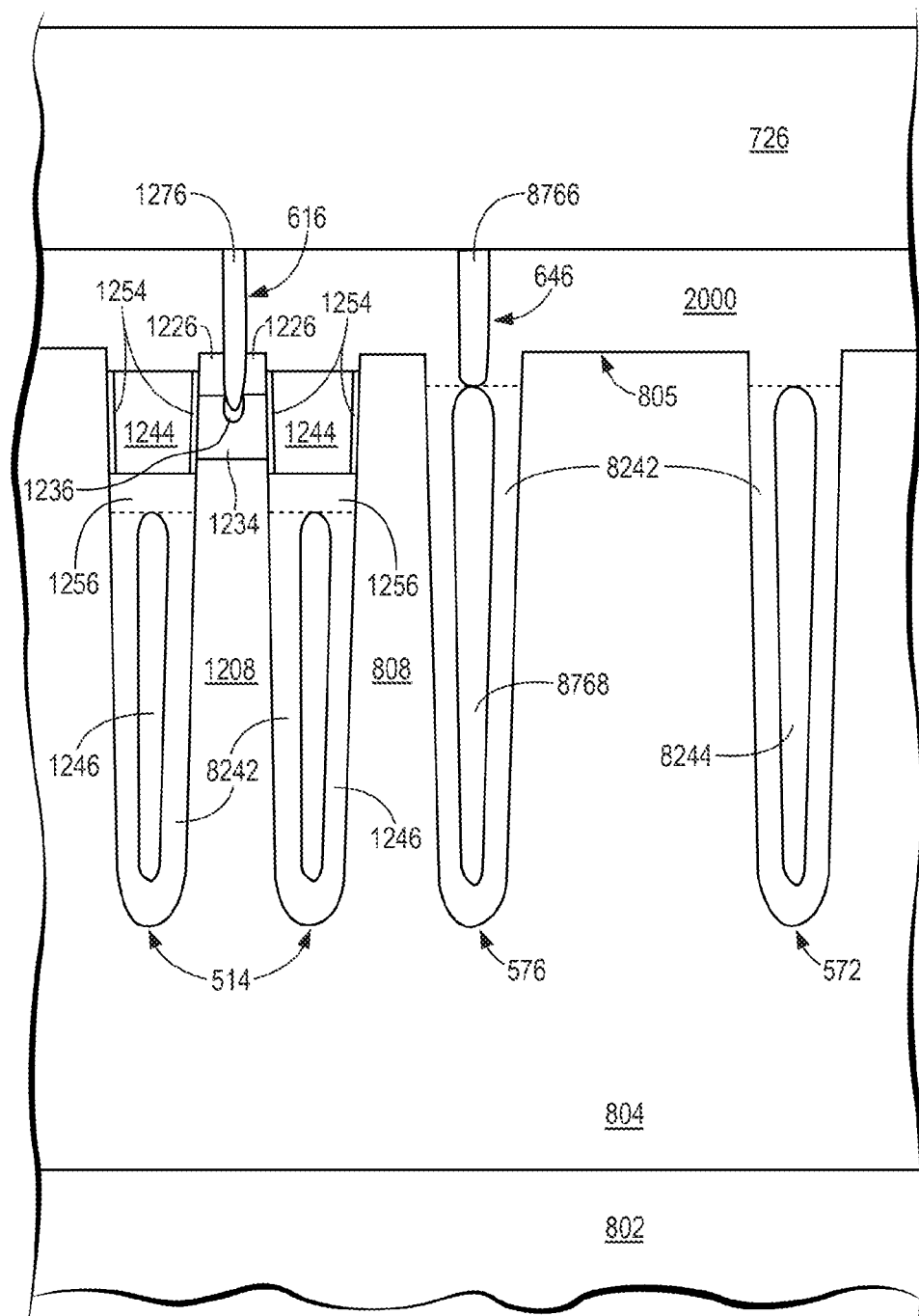
FIG. 12 includes an illustration of a cross-sectional view of an enlarged portion of the workpiece of features near the left-hand side of FIG. 8.

FIGS. 8, 9, 10, and 11 include cross-sectional views along sectioning lines 8-8, 9-9, 10-10, and 11-11 as illustrated in FIG. 7. FIG. 8 highlights features in the charge storage area 420 and a portion of the active area 410. FIG. 9 highlights features along of the charge storage area 420 in a direction perpendicular to the direction in FIG. 8. FIG. 10 highlights features including a p-well region and its corresponding top-side ohmic contact. FIG. 11 highlights features including a barrier doped region and its corresponding top-side ohmic contact. FIGS. 8 to 11 include many other features and are described below in more detail in conjunction with the circuits, components, regions, and masks as described with respect to the prior figures. FIG. 12 includes an enlarged portion of the active area 410 illustrated near the left-hand portion of FIG. 8. In FIGS. 8 to 12, many particular features are described as plural even if only one of the particular features is illustrated.

FIGS. 8 to 12 include a substrate 800 that includes a buried conductive region 802 and a semiconductor region 804 overlying the buried conductive region 802. A primary surface 805 lies along the upper surface of the semiconductor region 804. The buried conductive region 802 provides a heavily-doped drain region for the transistor structures of the transistor 110 and the heavily-doped drain region for the transistor 330 (FIG. 3). Within the transistor structures of the transistor 110, drift regions include at least portions of the semiconductor region 804 within pillars (between the trenches 514) and below body regions 1234, where such body regions 1234 are described in more detail later in this specification.

Each of the buried conductive region 802 and the semiconductor region 804 can be monocrystalline and include a semiconductor base material that includes at least one Group 14 element, such as Si, Ge, SiC, SiGe, or the like. In an embodiment, the buried conductive region 802 can be in the form of a semiconductor wafer. The semiconductor region 804 can be epitaxially grown from the buried conductive region 802. The buried conductive region 802 can be n-type doped or p-type doped and have a dopant concentration of at least $1 \times 10^{18}$ atoms/cm$^3$. The semiconductor region 804 can have the same conductivity type as the buried conductive region 802 and an average dopant concentration lower than the buried conductive region 802. In an embodiment, the semiconductor region 804 can have an average dopant concentration of at most $5 \times 10^{17}$ atoms/cm$^3$, and in a particular embodiment, of at most $1 \times 10^{17}$ atoms/cm$^3$. The semiconductor region 804 may have an average dopant concentration greater than $1 \times 10^{15}$ atoms/cm$^3$. Referring to the left-hand portion of FIG. 8, the average dopant concentration of the semiconductor region 804 within the pillars for the transistor structures of the transistor 110 is referred to herein as the background dopant concentration. Referring to FIG. 8, the background dopant concentration is the average dopant concentration for the portion of the pillar lying between trenches 514 and at elevations between the bottom of the body region 1234 and the bottoms of the trenches 514. In the embodiment as illustrated, the buried conductive region 802 and the semiconductor region 804 are n-type doped.

Portions of the isolation trench 572 are illustrated near the right-hand side and near the center of FIG. 8. An insulating layer 8242 lies along the sidewalls and bottom of the isolation trench 572 and the trenches 526. In an embodiment, the insulating layer 8242 is also formed within the trenches 514 and 576. The insulating layer 8242 can include one or more films of an oxide, a nitride, or an oxynitride. In an embodiment, the insulating layer 8242 can have a thickness in a range from 50 nm to 2000 nm.

A conductive member 8244 fills most or all of the remaining portion of the isolation trench 572. The conductive member 8244 can include a single film or a plurality of films. In an embodiment, the conductive member 8244 can include a doped semiconductor material, a refractory metal, a refractory silicide, or refractory nitride. Such conductive materials may include doped Si, doped SiC, Ta, TaSi, Ti, TiW, TiSi, TiN, W, or the like. In a particular embodiment, the conductive member 8244 includes a doped semiconductor material. Thus, the resistor 356 in FIG. 3 corresponds to the resistance due to the doped semiconductor composition of the conductive member 8244.

A conductive plug 8724 extends though the ILD layer 2000 and provides an electrical connection between the drain interconnect 722 and the conductive member 8244 within the isolation trench 572. The ILD layer 2000 can include a single film or a plurality of films. The single film or each of the films can include an oxide, a nitride, or an oxynitride. In an embodiment, the ILD layer 2000 can have a thickness in a range from 20 nm to 2000 nm. The conductive plug 8724 can include any of the materials as previously described with respect to the conductive member 8244. In a particular embodiment, the conductive plug 8724 includes W and may include an adhesion film and a barrier film between the W and the conductive member 8244.

The drain interconnect 722 electrically connects the conductive plugs 8722 and 8724 to each other. The drain interconnect 722 can include a single film or a plurality of films. In an embodiment, the drain interconnect 722 may include an adhesion film and a barrier film. Such films may include Ta, TaSi, Ti, TiW, TiSi, TiN, W, or the like. The drain interconnect 722 can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the drain interconnect 722. In an embodiment, the bulk film has a thickness in a range from 20 nm to 6000 nm and, in a more particular embodiment, in a range from 50 nm to 4000 nm. More or fewer films can be used in the drain interconnect 722.

The charge storage component further includes a compensation region 840. The compensation region 840 affects $C_{OSS}$ and, in particular, small-signal $C_{OSS}$. The compensation region 840 is a counter-doped region, where the average net dopant concentration of the compensation region 840 is significantly less than the background dopant concentration. The capacitance associated with the compensation region 840 can be function of the volume occupied by the compensation region 840. The x-direction and y-direction dimensions can be seen in FIG. 6, and the z-direction dimension corresponds to the thickness of the compensation region 840 as seen in FIG. 8. Hence, the dimensions of the compensation region 840 can be adjusted to obtain a desired capacitance.

The compensation region 840 having a low average net dopant concentration is desired. The compensation region 840 may be n-type or p-type. In an embodiment, the compensation region 840 has an average net dopant concentration of at most $5 \times 10^{16}$ atoms/cm$^3$, at most $1 \times 10^{16}$ atoms/cm$^3$, or at most $5 \times 10^{15}$ atoms/cm$^3$, and in another embodiment, the compensation region 840 has an average net dopant concentration of at most 0.50 times the background dopant concentration, at most 0.30 times the background dopant concentration, or at most 0.15 times the background dopant concentration. In another embodiment, the compensation region 840 has an average net dopant concentration of at least $1 \times 10^{12}$ atoms/cm$^3$. In an embodiment, the compensation region 840 has a thickness of at least 0.4 micron, at least 0.7 micron, or at least 1.1 microns, and in another embodiment, the compensation region 840 has a thickness of at most 9.0 microns, at most 6.0 microns, or at most 3.0 microns.

Heavily doped regions 842 in FIG. 8 are within the semiconductor region 804 at locations corresponding to the openings 632 in FIG. 6. The heavily doped regions 842 are adjacent to the primary surface 805. The heavily doped regions 842 can be formed during the same doping operation as the source regions 1226 for the transistor structures of the transistor 110.

Referring to FIG. 8, a gap 841 is disposed between the right-hand side of the compensation region 840 and the isolation trench 572. The gap 841 allows the buried conductive region 802 to be electrically coupled to the heavily doped region 842. The buried conductive region 802, the heavily doped regions 842, and the portion of the semiconductor region 804 within the gap 841 can have the same conductivity type. The conduction path between the buried conductive region 802 and the heavily doped region 842 via the gap 841 corresponds to the resistor 346 in FIG. 3. The heavily doped regions 842 form ohmic contacts to conductive plugs 8722, one of which is illustrated in FIG. 8. The drain interconnect 722 lies along a conduction path that allows the conductive member 8244 within the isolation trench 572 to be at approximately $V_{DD}$ when the electronic device is connected to power supplies.

The conductive plugs 8722 can include any of the materials as previously described with respect to the conductive plug 8724. The conductive plugs 8722 can have the same composition or a different composition as compared to the conductive plug 8724. In an embodiment, the conductive plugs 8722 and 8724 can be formed during the same processing sequence. In a particular embodiment, the bulk conductive material in the conductive plugs 8722 and 8724 is W. Although not illustrated in FIG. 8, the conductive plugs 8722 overlie and form ohmic contacts with contact body contact regions 1042, wherein the body contact regions 1042 have an opposite conductivity type as compared to the heavily doped regions 842. Thus, the conductive plugs 8722 electrically short the body contact regions 1042 and the heavily doped regions 842 to one another.

A barrier doped region 850 is disposed between the compensation region 840 and the primary surface 805 of the semiconductor region 804. The barrier doped region 850 may also be called an inversion threshold control region as it helps to increase the voltage needed to reach inversion in the p-channel IGFET 312. The barrier doped region 850 can be part of the n-type region of the pn junction of component 210 in FIG. 2, the n-type region that includes the channel region of the p-channel IGFET 312 in FIG. 3, and the n-type region that includes the base region of the pnp bipolar transistor 314. The barrier doped region 850 can help improve $C_{OSS}$, including small-signal $C_{OSS}$ and dynamic $C_{OSS}$.

In a particular embodiment, the barrier doped region 850 is at an elevation between the compensation region 840 and the bottoms of the body contact regions 1042. The barrier doped region 850 and the compensation region 840 may be formed using the same mask (as illustrated by opening 640 in FIG. 6) or different masks. In an embodiment, the barrier doped region 850 may be formed with a mask different from the mask used for the compensation region 840, so that the barrier doped region 850 extends over the gap 841 and closer to the isolation trench 572 to help lower the resistance of the resistor 346 in FIG. 3. The barrier doped region 850 is electrically coupled to the conductive plugs 8722 via the heavily doped regions 842.

The barrier doped region 850 may have an average dopant concentration higher than the background dopant concentration; however, the average dopant concentration is not so high as to render the p-channel transistor 312, and pnp bipolar transistor 314, or both ineffective, if such transistors are desired. In an embodiment, the barrier doped region 850 has an average dopant concentration that is at least 1.1 times higher, at least 1.2 times higher, or at least 1.4 times higher than the background dopant concentration, and in another embodiment, the barrier doped region 850 has an average dopant concentration that is at most 9.0 times higher, at most 6.0 times higher, or at most 4.0 times higher than the background dopant concentration. In a particular embodiment, the barrier doped region 850 has an average dopant concentration in a range from $3 \times 10^{16}$ atoms/cm$^3$ to $1 \times 10^{18}$ atoms/cm$^3$. In an embodiment, the barrier doped region 850 has a thickness of at least 0.11 microns, at least 0.2 microns, or at least 0.3 microns, and in another embodiment, the barrier doped region 850 has a thickness of at most 1.5 microns, at most 1.1 microns, or at most 0.9 micron. The peak dopant concentration within the barrier doped region may be at an elevation in a range from 0.5 micron to 1.5 microns below the primary surface 805 of the semiconductor region 804.

Near the left-hand side of FIG. 8, the trench 576 is closer to the active area 410 than to the peripheral area 440. The trench 576 includes a conductive member 8768. The insulating layer 8242 is disposed between the conductive member 8768 and sidewalls and a bottom of the trench 576. A conductive plug 8766 contacts the source interconnect 726 and the conductive member 8768. During operation, the conductive member 8768 can help to ensure that the breakdown voltage between a source region of a transistor structure closest to the charge storage area 420 and any portion of a charge storage component that is at or near the drain voltage is greater than the breakdown voltage between the source and drain of a transistor structure of the transistor 110. The conductive member 8768 can include any of the materials as described with respect to the conductive member 8244 (within the isolation trench 572). The conductive members 8768 and 8244 can have the same composition or different compositions. The conductive plug 8766 can include any of the materials as described with respect to the conductive plug 8724 (associated with the isolation trench 572). The conductive plugs 8724 and 8766 can have the same composition or different compositions.

A pillar 808 is disposed between the trenches 576 and 514, and a pillar 1208 is disposed between the trenches 514. The pillars 808 and 1208 will be addressed in more detail with respect to FIG. 12.

Skilled artisans will appreciate that some features are present but are not illustrated in FIG. 8 to improve understanding of the device. For example, a gate dielectric layer is disposed between the gate electrodes 1244 and the sidewalls of the trenches 514. The gate dielectric layer is illustrated and described with respect to FIG. 12. Features within the active area 410 are described in more detail later in the specification with respect to FIG. 12.

FIG. 9 includes a cross-sectional view in a direction substantially perpendicular to the view illustrated in FIG. 8. Many of the features in FIG. 9 are discussed with respect FIG. 8. Some features in FIG. 9 may or may not be present in FIG. 8, and such features, if present in FIG. 8, are not described with respect to FIG. 9 to simplify understanding of features in FIG. 9.

Conductive members 8764 fill most or all of the remaining portion of the trenches 526. The conductive members 8764 can include any of the materials as previously described with respect to the conductive member 8244. The conductive members 8764 can include the same composition or different composition as compared to the conductive member 8244. In a particular embodiment, the conductive members 8764 include a doped semiconductor material that has a substantially higher resistivity as compared to a metal (e.g., W) or a metal alloy (Al—Cu). Thus, the resistor 356 in FIG. 3 corresponds to the resistance of the conductive members 8764 in view of their doped semiconductor composition.

Referring to FIGS. 7 and 9, conductive plugs 8722, corresponding to openings 642 in FIG. 7, extend though an ILD layer 2000 and provide an electrical connection between the drain interconnect 722 and the p-well regions 1044 between the trenches 526. Similar conductive plugs, not illustrated in FIG. 9, corresponding to openings 646 in FIG. 7, extend through an ILD layer 2000 and provide an electrical connection between the source interconnect 726 and the conductive members 8764 within the trenches 526. The conductive plugs 8722 can include any of the materials as previously described with respect to the conductive plugs 8724. In a particular embodiment, the conductive plugs 8722 include W and may include an adhesion film and a barrier film between the W and the body contact regions 1042.

FIG. 10 includes an enlarged portion of the charge storage component to illustrate better features within one of the pillars and its adjacent trenches 526. Referring to FIGS. 9 and 10, a p-well region 1044 is adjacent to the primary surface 805. The p-well region 1044 can be formed at the same time as the body regions 1234 (FIGS. 8 and 12) for the transistor structures of the transistor 110. The dopant concentration may be determined, in part, to achieve a threshold voltage needed or desired for the transistor 110. In another embodiment, the p-well region 1044 may be formed at a different time than the body regions 1234 and designed for the particular performance requirements or desires for the charge storage component. In an embodiment, the p-well region has an average dopant concentration in a range from $1 \times 10^{16}$ atoms/cm$^3$ to $5 \times 10^{17}$ atoms/cm$^3$. The p-well region 1044 can have depth in a range from 0.2 micron to 1.3 microns.

Body contact regions 1042 have the same conductivity type as the p-well region 1044 and have a peak concentration of at least $5 \times 10^{18}$ atoms/cm$^3$, and in a particular embodiment, the peak dopant concentration is at most $5 \times 10^{21}$ atoms/cm$^3$. The body contact regions 1042 lie adjacent to and form ohmic contacts with the conductive plugs 8722. The conductive plugs 8722 electrically connect the body contact regions 1042 and the heavily doped regions 842 to one another. During operation of the electronic device, the p-well regions 1044, which can be the source of the p-channel IGFET 312 and the emitter of the pnp bipolar transistor 314, can be maintained at or near the voltage of the drain terminal 102.

Referring to FIG. 10, the barrier doped region 850 is disposed between the compensation region 840 and the p-well regions 1044. The barrier doped region 850 may contact or be spaced apart from each of the compensation region 840 and the p-well region 1044. FIG. 10 includes the p-well region 1044 near the tops of the pillars. FIG. 11 includes a portion of the charge storage area 420 that includes the compensation region 840 but is outside the p-well region 1044. A portion of the semiconductor region 804 at or near the background dopant concentration is disposed between the heavily doped regions 842 and the barrier doped region 850. Such portion of the semiconductor region 804 may correspond to the resistor 316 between the emitter and base of the pnp transistor 314 in FIG. 3.

FIG. 12 includes an enlarged portion of the active area near the left-hand side of FIG. 8. Referring to FIGS. 8 and 12, the pillars for the transistor structures of the transistor 110 include many of the features that are in the charge storage component 120. Accordingly, the process integration of the transistor structures of the transistor 110 and the features in the charge storage area 420 can be achieved without adding too many process operations. Unlike the charge storage area 420, the pillars for the transistor structures do not include the compensation region 840 and the barrier doped region 850. Although FIG. 12 illustrates one pillar with a transistor structure, the transistor 110 can include many other pillars with transistor structures.

The trenches 514 within the active area 410 include shield electrodes 1246 and gate electrodes 1244. Although not illustrated in FIG. 12, portions of the shield electrodes 1246 are not significantly recessed within the trenches 514 to allow conductive plugs (not illustrated) to electrically connect the shield electrodes 1246 to the source interconnect 726. The insulating layer 8242 is disposed between (1) the shield electrodes 1246 and (2) the bottoms and the lower portions of sidewalls of the trenches 514. An insulating layer 1256 is disposed between the shield electrodes 1246 and the gate electrodes 1244. A gate dielectric layer 1254 is disposed between the gate electrodes 1244 and the upper portions of sidewalls of the trenches 514. After reading this specification in its entirety, skilled artisans will appreciate that the gate dielectric layer 1254 is present even if the gate dielectric layer is not illustrated in some of the figures, such as FIGS. 8, 28, and 30.

The gate electrodes 1244 may be recessed within the trenches 514 to reduce gate-to-source capacitance. The upper surfaces of each of the gate electrodes 1244 can lie at an elevation higher than corresponding body regions 1234 near one or both sides of the gate electrodes 1244. The lower surface of each gate electrode 1244 can lie at an elevation lower than corresponding body regions 1234 near one or both sides of the gate electrodes 1244. Although not illustrated, the gate electrodes 1244 are electrically coupled to the gate terminal 104.

Within the pillars, the body regions 1234 are disposed between source regions 1226 at the primary surface 805 and drift regions for the transistor structures. Body contact regions 1236 are adjacent to contact openings 616, and conductive plugs 1276 are within the contact openings 616 and contact the body contact regions 1236 and the source regions 1226. Thus, the body contact regions 1236 and the source regions 1226 form ohmic contacts to the conductive plugs 1276. The body contact regions 1236 can have substantially the same dopant concentration or significantly different dopant concentrations as compared to the body contact regions 1042. The source regions 1226 can have the same conductivity type as the heavily doped regions 842 within the charge storage area 420. The source regions 1226 can have substantially the same dopant concentration or significantly different dopant concentrations as compared to the heavily doped regions 842. The source interconnect 726 contacts the conductive plugs 1276.

The shield electrodes 1246 and gate electrodes 1244 can include any of the materials as previously described with respect to the conductive member 8244. The shield electrodes 1246 can include the same composition or different composition as compared to the conductive member 8244. The gate electrodes 1244 can include the same composition or different composition as compared to the conductive member 8244. The portions of the gate electrodes 1244 can include a material closest to the gate dielectric layer 1254 that sets the work function and affects the threshold voltage of the transistor 110.

The insulating layer 1256 and the gate dielectric layer 1254 can have any of the compositions previously described with respect to the insulating layer 8242. The insulating layer 1256, the gate dielectric layer 1254, and the insulating layer 8242 can have the same composition or different compositions as compared to one another. The insulating layer 1256 can have a thickness in a range from 50 nm to 900 nm. The gate dielectric layer 1254 can have a thickness in a range from 5 nm to 120 nm.

The body regions 1234 can have the same conductivity type as the p-well region 1044 within the charge storage area 420. The body regions 1234 can have any of the average dopant concentrations as described with respect the p-well region 1044. The body regions 1234 can have substantially the same or significantly different average dopant concentrations as compared to p-well region 1044. The body contact regions 1236 can have the same conductivity type as the body contact regions 1042 within the charge storage area 420.

In the embodiment as illustrated, the pillar 808 between the trenches 576 and 514 has the same composition and dopant concentration profile at similar elevations as a portion of the semiconductor layer 804 to the right of the isolation trench 572. In another embodiment, a p-well region similar to the body region 1234 can be formed near the top of the pillar 808. The ILD layer 2000 can be patterned to define a contact opening to similar to the contact opening 616. The contact opening extends into the p-well region within the pillar 808. The bottom of the contact opening can be doped to form a p-well contact region similar to the body contact region 1236. A conductive plug similar to the conductive plug 1276 can be formed to electrically connect the p-well region and p-well contact region within the pillar 808 to the source interconnect 726. To aid in visualizing the embodiment, the top of the pillar 808 would look substantially identical to top of the pillar 1208 except that the source regions 1226 are not formed within the pillar 808.

The source interconnect 726 electrically connects the conductive plugs 1276 and 8766 and other conductive plugs (not illustrated in FIG. 12) to the conductive members 8768 to one another. The source interconnect 726 is coupled to the source terminal 106. The source interconnect 726 can include the same composition or a different composition as compared to the drain interconnect 722. The source interconnect 726 and the drain interconnect 722 can be formed during the same or different processing sequence.

The conductive plugs are not required in all embodiments. In an embodiment, the drain and source interconnects 722 and 726 can extend through the openings in the ILD layer 2000 and make contact to doped semiconductor material along the bottom and sidewalls of the openings where conductive plugs would otherwise be formed. In such an embodiment, the drain interconnect 722 makes ohmic contacts to the body contact regions 1042, and the heavily doped regions 842 and 1042, and the conductive member 8244, and the source interconnect 726 makes ohmic contacts to the body contact regions 1236, and the source regions 1226, and the conductive members 8764 and 8768.

In another embodiment, the drain interconnect 722 may extend to the peripheral area 440 and make contact to a feature in the peripheral area 440 that may be at $V_{DD}$. In such an embodiment, the compensation region 840 can be used without the gap 841. In still another embodiment, the drain interconnect 722 may not be present. For example, referring to FIG. 6, the openings 642 may be extended to and intersect the opening 672. The conductive plugs 8722 and 8724 can be replaced by a conductive plug that contacts the conductive member 8244 (within the isolation trench 572), the heavily doped regions 842, and the body contact regions 1042.

Figure 13:
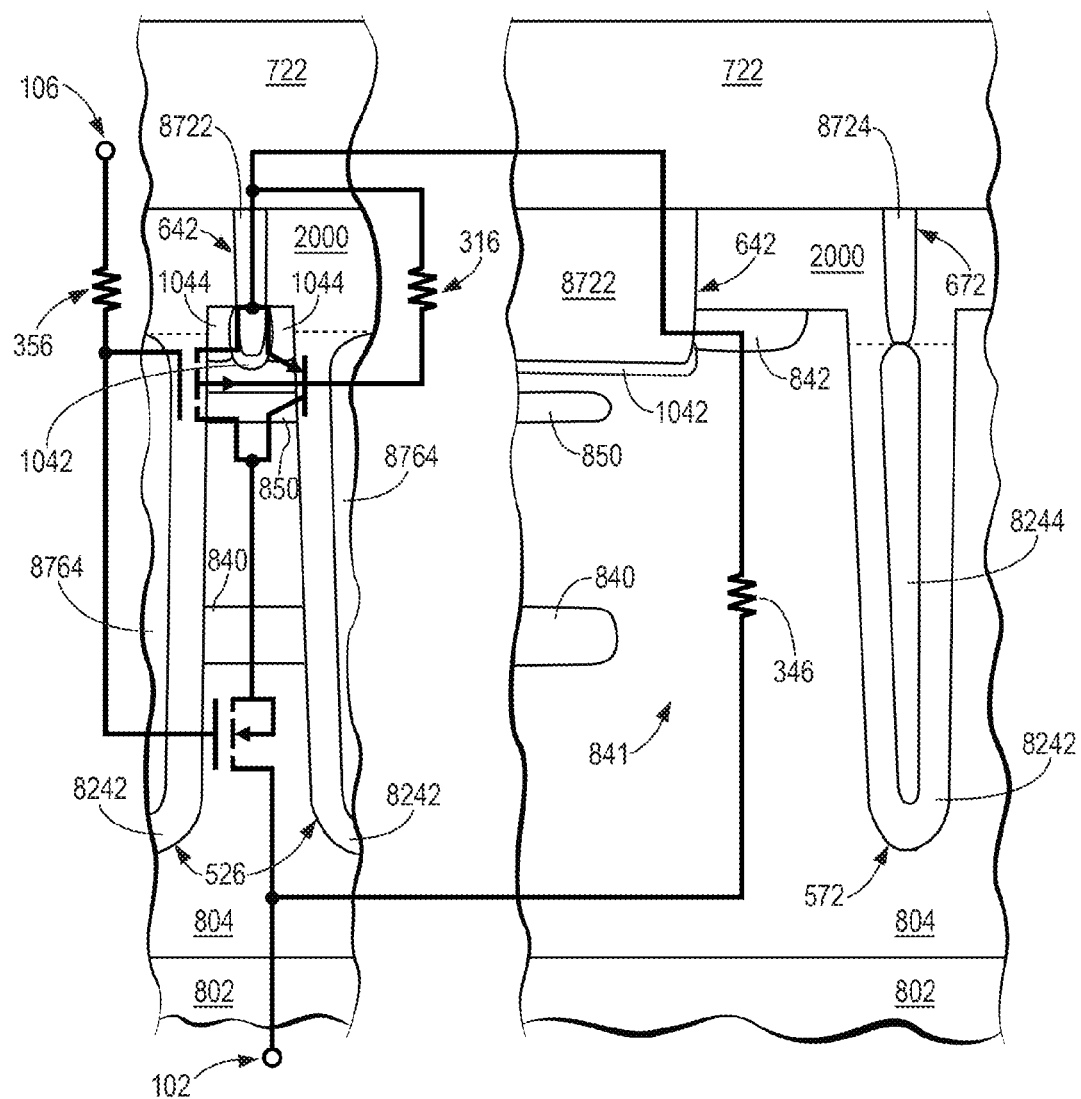
FIG. 13 includes an illustration of a hybrid circuit-cross-sectional view of the workpiece to improve understanding of a correlation between components within the circuit and physical structures within the electronic device.

FIG. 13 includes a hybrid circuit-cross-sectional view to improve understanding of how the electrical components within the circuit of FIG. 3 map to a physical embodiment. The pillar near the left-hand side is along the view as seen in FIG. 10, and the portion near the right-hand side corresponds to the gap 841 and drain interconnect 722. Referring to the right-hand pillar of FIG. 13, the resistor 346 corresponds to the conduction path from the buried doped region 802 to the heavily doped region 842 via the gap 841.

Referring to the left-hand pillar in FIG. 13, the p-well region 1044 corresponds to the source of the p-channel IGFET 312 and the emitter of the pnp bipolar transistor 314. The portion of the pillar between the p-well region 1044 and the compensation region 840, which includes the barrier doped region 850 in this embodiment, includes the channel region of the p-channel IGFET 312, the base of the pnp bipolar transistor 314, and the source of the n-channel IGFET 330. The compensation region 840 corresponds to the drain of the p-channel IGFET 312, the collector of the pnp bipolar transistor 314, and the channel region of the n-channel IGFET 330. The portion of the pillar below the compensation region 840 corresponds to the drain region of the n-channel IGFET 330. The resistor 356 corresponds to the conductive members 8764 when the conductive members 8764 include a doped semiconductor material.

Figure 14:
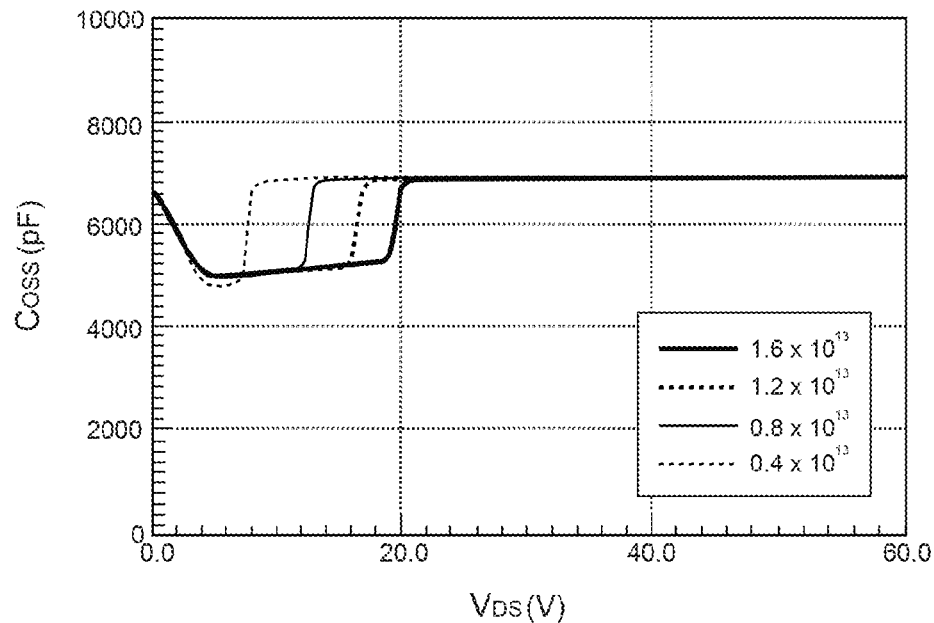
FIG. 14 includes a plot of small-signal $C_{OSS}$ as a function of $V_{DS}$ based on simulations using the circuit in FIG. 3 and different average net dopant concentrations for a compensation region within the charge storage component.
Figure 15:
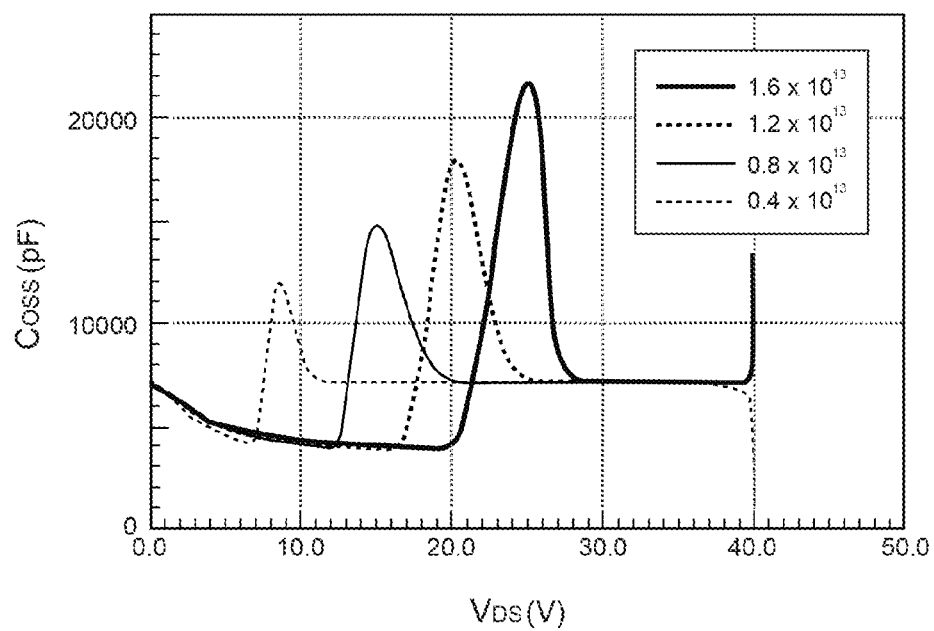
FIG. 15 includes a plot of dynamic $C_{OSS}$ as a function of $V_{DS}$ based on simulations using the circuit in FIG. 3 and different average net dopant concentrations for a compensation region within the charge storage component.

FIGS. 14 and 15 include plots of small-signal $C_{OSS}$ and dynamic $C_{OSS}$, respectively, as a function of $V_{DS}$ based on simulations for different implant doses (in units of ions/cm²) for the barrier doped region 850. As previously discussed, the barrier doped region 850 controls the inversion threshold of the charge storage component. Both the small-signal $C_{OSS}$ and dynamic $C_{OSS}$ dramatically rise once the $V_{DS}$ exceeds this threshold. Higher implant doses result in higher threshold voltages. The simulations are based on the circuit in FIG. 3. The dips in the plots for small-signal $C_{OSS}$ in FIG. 14 and the rise in the dynamic $C_{OSS}$ in FIG. 15 demonstrate that the charge storage component exhibits non-linear capacitive behavior when $V_{DS\ is}$ ramped from 0 V to 30 V.

Figure 16:
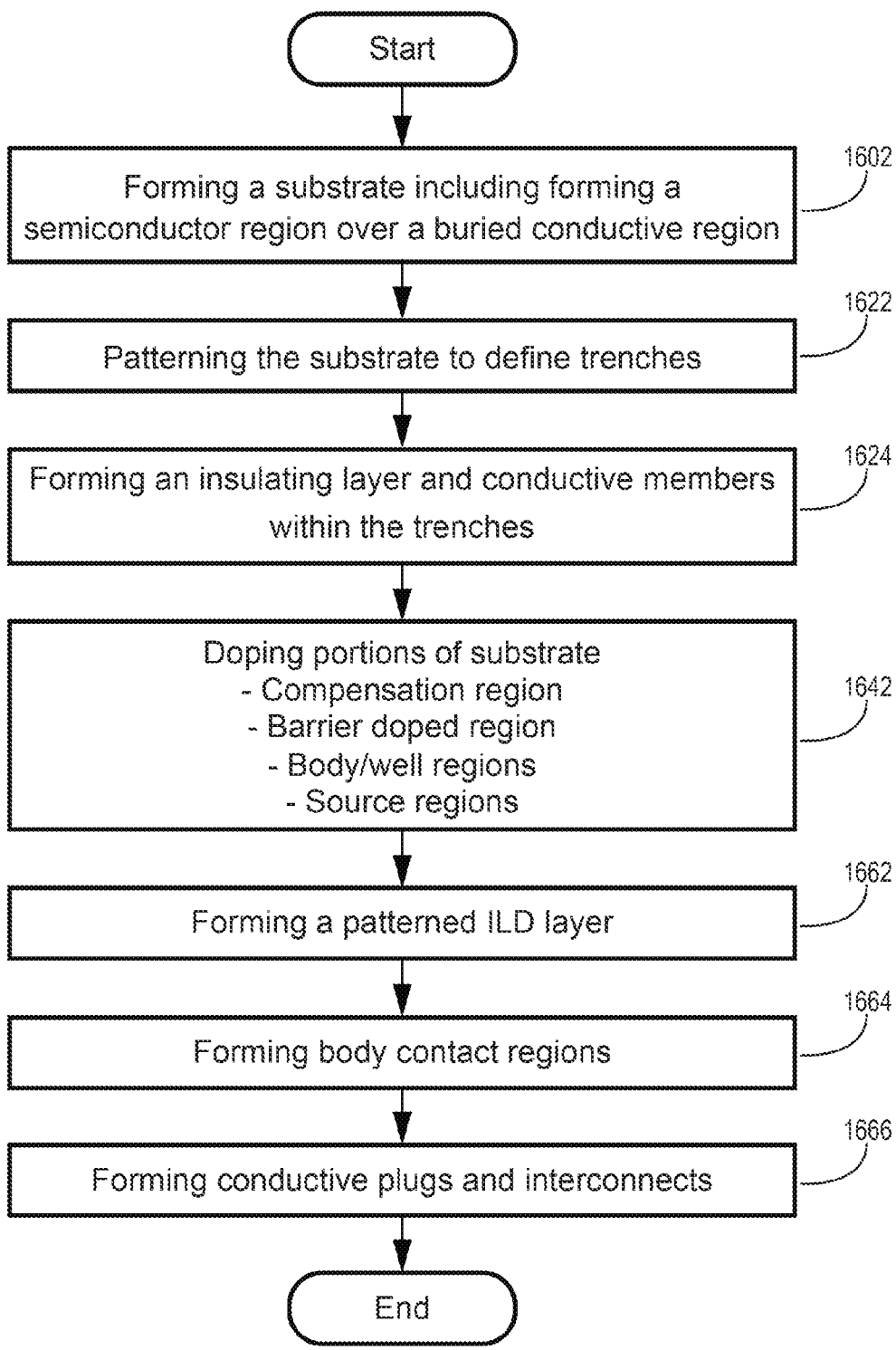
FIG. 16 includes a process flow diagram in accordance with a set of embodiments.

FIG. 16 includes a process flow in accordance with the first set of embodiments. The process can include forming a substrate including forming a semiconductor region over a buried conductive region, at block 1602. In an embodiment, the semiconductor region 804 can be a semiconductor layer epitaxial grown from the conductive buried region 802. As originally deposited, the semiconductor region 804 can be doped to have a uniform dopant concentration. In another embodiment, relative to the average dopant concentration of the semiconductor region 804 as formed, the semiconductor layer may be deposited so that it has a relatively higher dopant concentration near the buried doped region 802 or a relatively lower dopant concentration near the primary surface 805 of the semiconductor region 804. In another embodiment, doping of the semiconductor layer to form the semiconductor region 804 may be performed at least in part by ion implantation.

The process can also include patterning the substrate to define trenches, at block 1622, and forming an insulating layer and conductive members within the trenches, at block 1624. For most of the trenches, the insulating layer 8242 and conductive member fill nearly all of the trenches. However, for the transistor structures, the conductive members within the trenches 514 are shield electrodes 1246 and are recessed from the tops of the trenches 514 to allow gate electrodes 1244 to be subsequently formed within trenches 514.

The process can further include doping portions of substrate, at block 1642. Many doped regions formed within the semiconductor region 804 are performed using different doping operations. The doping is performed to form the compensation region 840, the barrier doped region 850, body regions 1234, the p-well region 1044, the source regions 1226, the doped regions 842 and doped others. After reading this specification, skilled artisans will be able to determine an order in which doped regions will be formed. One or more than one thermal cycle can be performed to activate the dopants.

The process can also include forming a patterned ILD layer, at block 1662, forming body contact regions, at block 1664, and forming conductive plugs and interconnects, at block 1666. After depositing the ILD layer 2000, the ILD layer 2000 can be patterning to define contact openings. In an embodiment, contact openings to semiconductor region 804 may be subsequently doped to form body contact regions 1042 and 1236. Contact openings to conductive members may not receive the doping for the body contact regions. The contact openings can be filled with conductive plugs, and the drain interconnect 722, the source interconnect 726, and a gate interconnect (not illustrated) to gate electrodes 1244 can be formed and contact the conductive plugs. In another embodiment, the conductive plugs may not be formed, and the interconnects can extend into the contact openings and contact doped semiconductor materials.

Further interconnect levels, a passivation layer, or a polyimide layer can be formed if needed or desired to form a substantially completed electronic device.

Second Set of Embodiments

In a second set of embodiments, the pillars within the charge storage component 120 can be made narrower. For example, in the first set of embodiments, the widths of the pillars for the transistor 110 within the active area 410 and the widths of the pillars within the charge storage component 120 within the charge storage area 420 may be substantially the same. The area occupied by the charge storage area 420 can be significantly less for this embodiment as compared to the first set of embodiments.

Figure 17:
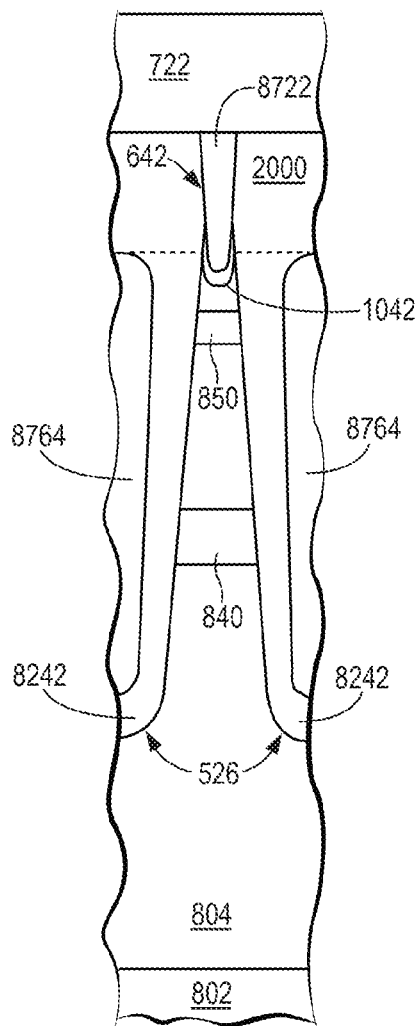
FIG. 17 includes an illustration of a cross-sectional view of a portion of a workpiece in accordance with another set of embodiments.

Referring to FIG. 17, the pillars within the charge storage area may be sufficiently narrow, so that the p-well region 1044 as seen in FIG. 10 is not needed. In FIG. 17, the body contact regions 1042 are at the top of the pillars adjacent to the conductive plugs 8722 within the contact openings 642. The conductive plugs 8722 make ohmic contact with the heavily doped regions 842 as illustrated in FIG. 8. In an embodiment, a process flow for forming an electronic device corresponding to FIG. 17 can be the same as the process flow as illustrated in FIG. 16 except that the p-well region may or may not be formed within the charge storage area 420 (the opening 624 in FIG. 6 is not present). The body region 1234 (FIG. 8) may still be formed for the transistor structures of the transistor 110 in active area 410.

The circuit corresponding to FIG. 17 is the same as FIG. 3. However, the source of the p-channel IGFET 312 and the emitter of the pnp bipolar transistor 314 are the body contact regions 1042, as opposed to a combination of the body contact regions 1042 and the p-well region 1044 as illustrated in FIG. 10. The electrical performance of the circuit is changed in view of the different physical configuration of features within the charge storage component.

Figure 18:
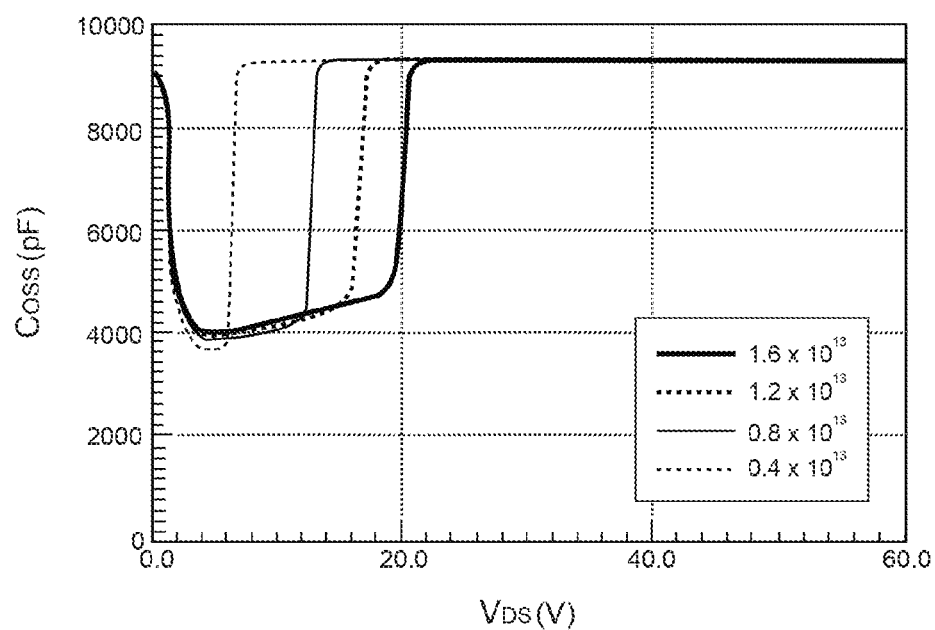
FIG. 18 includes a plot of small-signal $C_{OSS}$ as a function of $V_{DS}$ based on simulations using the circuit in FIG. 3 and different average net dopant concentrations for a compensation region within the charge storage component corresponding to FIG. 17.

FIG. 18 includes plots of small-signal $C_{OSS}$ as a function of $V_{DS}$ based on simulations for different implant doses for the barrier doped region 850. The simulations are based on the circuit in FIG. 3. The dips in the plots for small-signal $C_{OSS}$ (difference in small-signal $C_{OSS}$ at 0 V and the lowest small-signal $C_{OSS}$) in FIG. 18 are significantly greater than the dips seen in FIG. 14. For example, the dips in small signal $C_{OSS}$ in FIG. 18 are in a range from 4000 pF to 5000 pF, whereas the dips in small-signal $C_{OSS}$ in FIG. 14 are in a range from 1800 pF to 2200 pF.

Third Set of Embodiments

Figure 19:
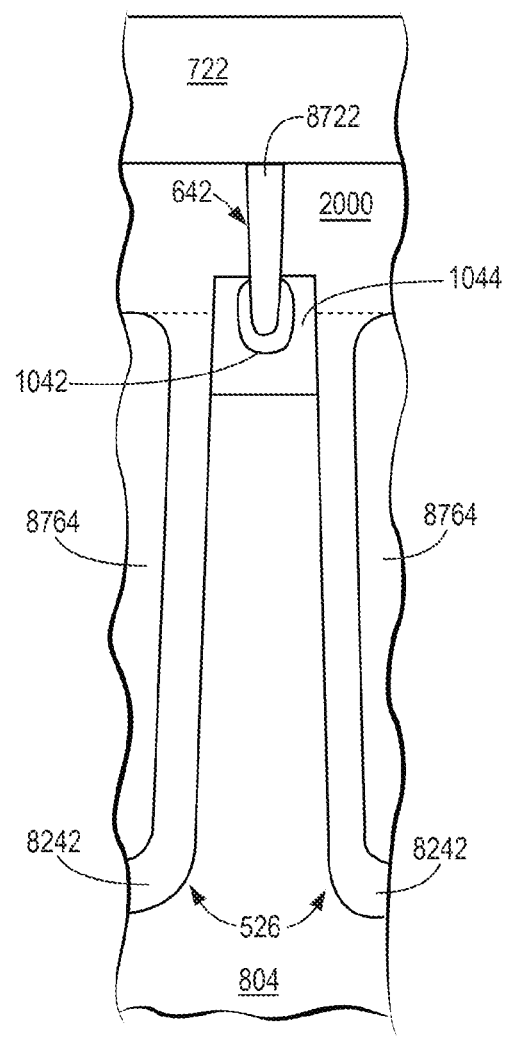
FIG. 19 includes an illustration of a cross-sectional view of a portion of a workpiece in accordance with still another set of embodiments.

In another set of embodiments, the compensation region 840, the barrier doped region 850, or both may be omitted. Referring to FIG. 6, the opening 640 is not present in the third set of embodiments, as the doping operations for the compensation 840 and the barrier doped region 850 are not performed. All other lithographic patterns in FIGS. 5 to 7 may remain the same, including the opening 624 corresponding to the p-well region 1044, openings 632 corresponding to locations within the charge storage area 420 that receive the source implant, and the contact openings 642. FIG. 19 includes a cross-sectional view at a location similar to FIG. 10 except the compensation region 840 and barrier doped region 850 are removed. Many of features in FIG. 19 have been previously described.

Figure 20:
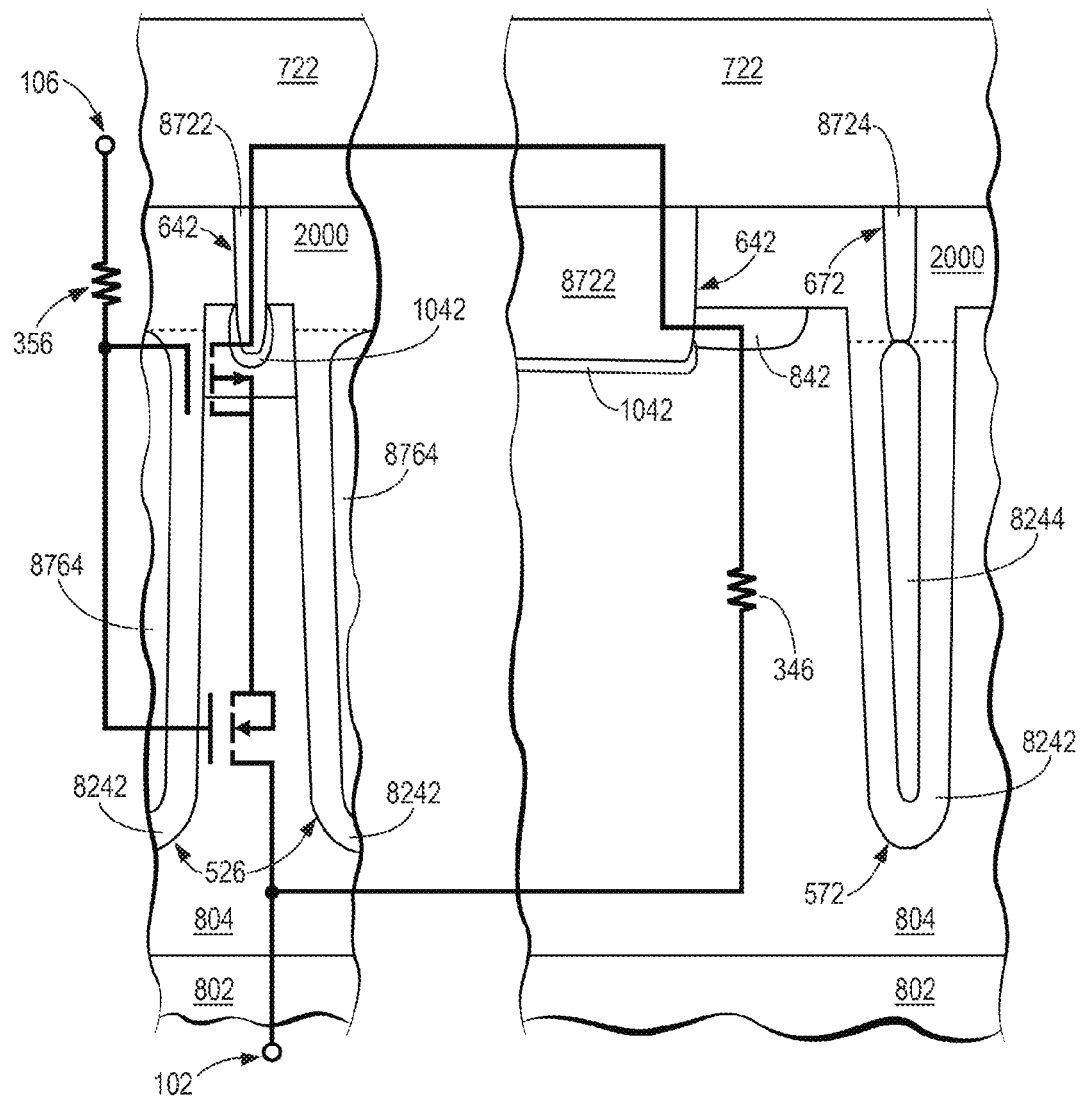
FIG. 20 includes an illustration of a hybrid circuit-cross-sectional view of the workpiece in FIG. 19 to improve understanding of a correlation between components within the circuit and physical structures within the electronic device.

The circuit corresponding to the third set of embodiments is the same as the circuit in FIG. 3, except the pnp bipolar transistor 314 is removed. FIG. 20 includes a hybrid circuit-cross-sectional view to improve understanding of how the electrical components within the circuit map to a physical embodiment. In simulations, the upper portion of the pillar corresponds to the p-channel transistor 312, and the lower portion of the pillar corresponds to the n-channel IGFET 330.

Figure 21:
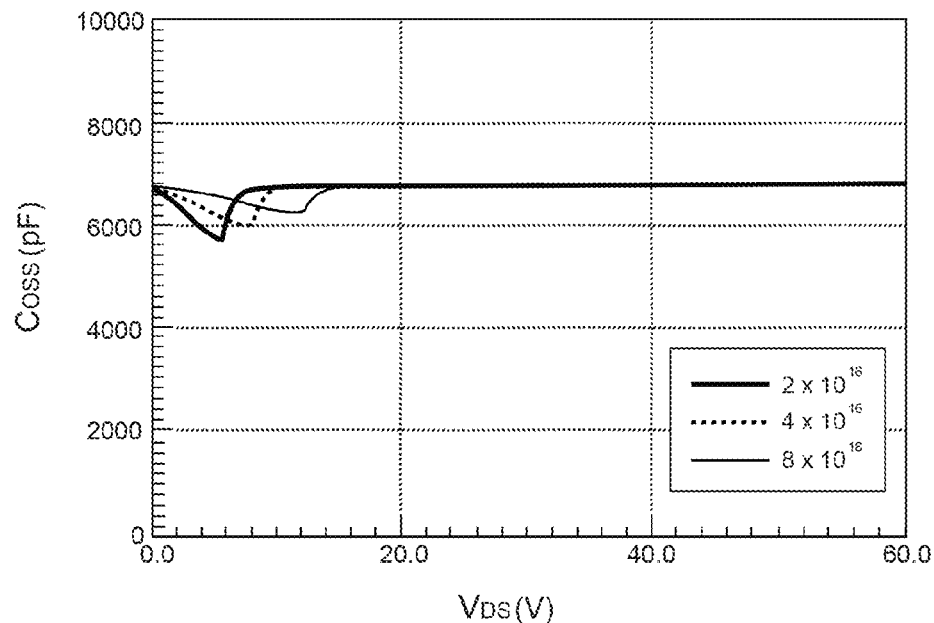
FIG. 21 includes a plot of small-signal $C_{OSS}$ as a function of $V_{DS}$ based on simulations using the circuit in FIG. 20 and different resistivities corresponding to different background dopant concentrations within the pillar.
Figure 22:
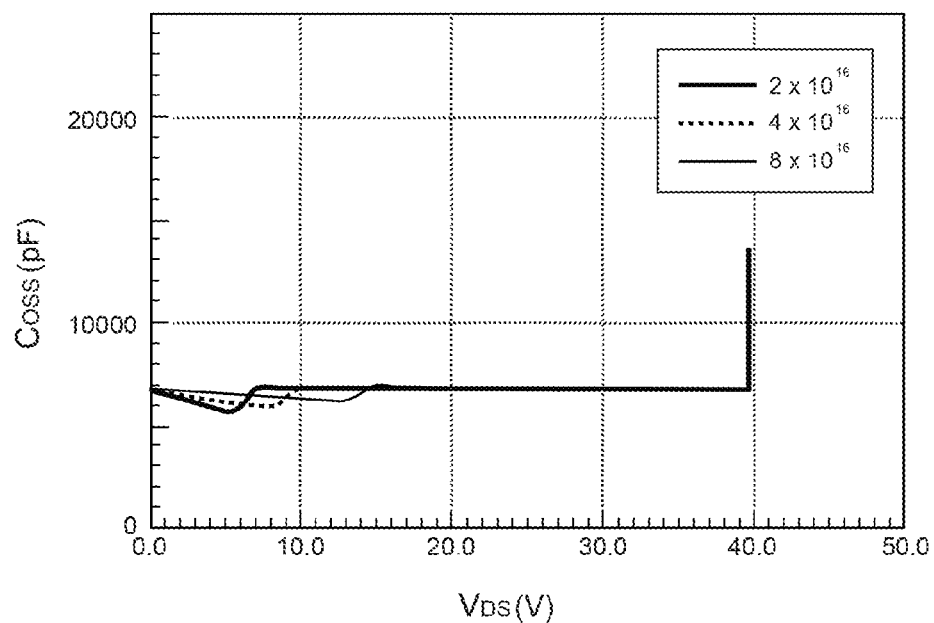
FIG. 22 includes a plot of dynamic $C_{OSS}$ as a function of $V_{DS}$ based on simulations using the circuit in FIG. 20 and different resistivities corresponding to different background dopant concentrations within the pillar.

FIGS. 21 and 22 include plots of small-signal $C_{OSS}$ and dynamic $C_{OSS}$, respectively, as a function of $V_{DS}$ based on simulations for different background dopant concentrations (in units of atoms/cm$^3$). The simulations are based on the circuit in FIG. 20. The dips in the plots for small-signal $C_{OSS}$ in FIG. 21 and the rise in the dynamic $C_{OSS}$ in FIG. 22 demonstrate that the charge storage component exhibits non-linear capacitive behavior when $V_{DS}$ is ramped from 0 V to 30 V. As compared to the prior embodiments, the dips in the plots for small-signal $C_{OSS}$ and the rise in the dynamic $C_{OSS}$ are significantly smaller for the third set of embodiments. Still, the third set of embodiments can be implemented into the process flow used to form the transistor 110 without having to add any masking or doping operations.

Fourth Set of Embodiments

Figure 23:
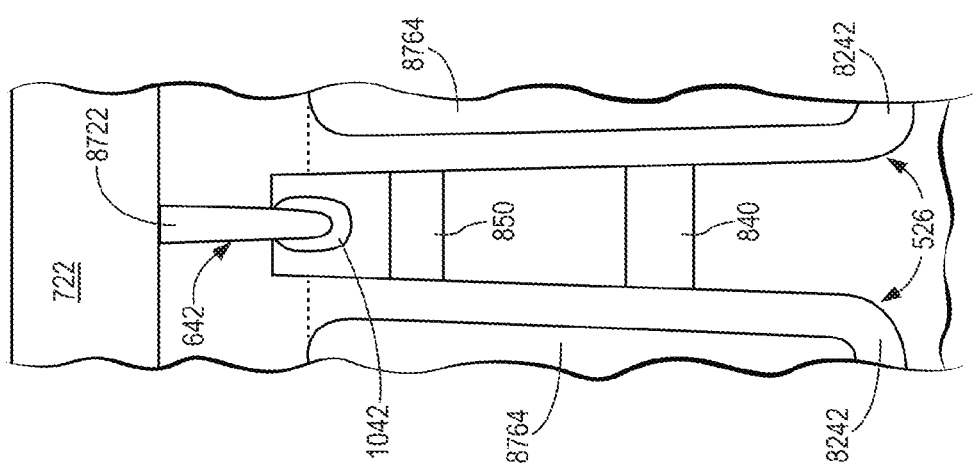
FIG. 23 includes an illustration of a cross-sectional view of a portion of a workpiece in accordance with a further set of embodiments.

In another set of embodiments, the p-well region 1044 within the charge storage component may be omitted. Referring to FIG. 6, the opening 624 is not present. The body region 1234 for the transistor 110 is still formed. All other lithographic patterns in FIGS. 5 to 7 may remain the same, including (1) the opening 640 corresponding to the compensation region 840 and barrier doped region 850, (2) openings 632 corresponding to locations within the charge storage area 420 that receive the source implant, and (3) the contact openings 642. FIG. 23 includes a cross-sectional view at a location similar to FIG. 10 except the p-well region 1044 is removed. Many of features in FIG. 23 have been previously described.

Figure 24:
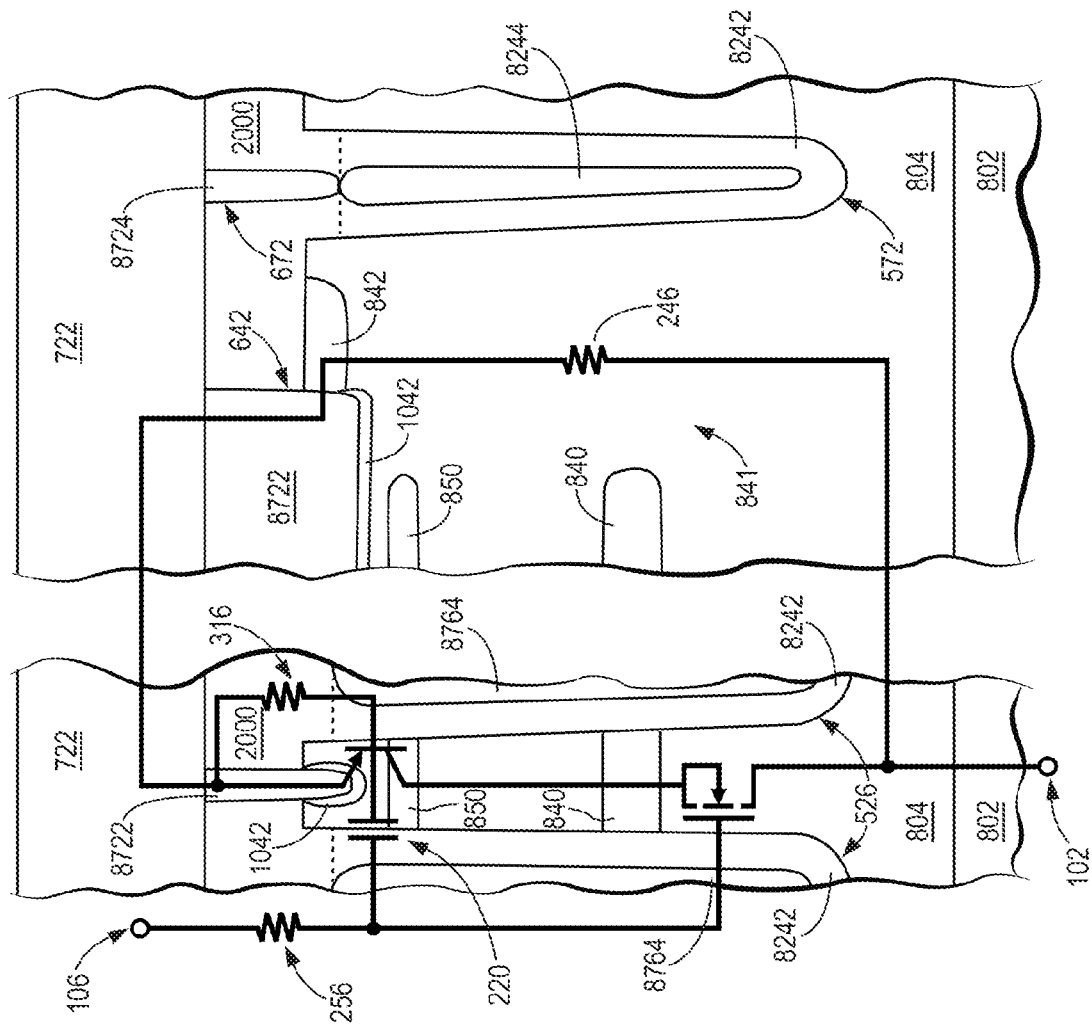
FIG. 24 includes an illustration of a hybrid circuit-cross-sectional view of the workpiece in FIG. 23 to improve understanding of a correlation between components within the circuit and physical structures within the electronic device.

The circuit corresponding to the fourth set of embodiments is substantially the same as the circuit in FIG. 2, where the component 210 is a pnp bipolar transistor, such as the pnp bipolar transistor 314 (FIG. 3), instead of a pn diode. FIG. 24 includes a hybrid circuit-cross-sectional view to improve understanding of how the electrical components within the circuit map to a physical embodiment. In simulations, an electrode of the charge storage element 220 corresponds to the pillar that includes the active region of the pnp bipolar transistor and the other electrode of the charge storage element 220 corresponds to an upper portion of the conductive member 8764. The n-channel IGFET 220 can have any of the compositions and properties as previously described with respect to the n-channel IGFET 330.

Figure 25:
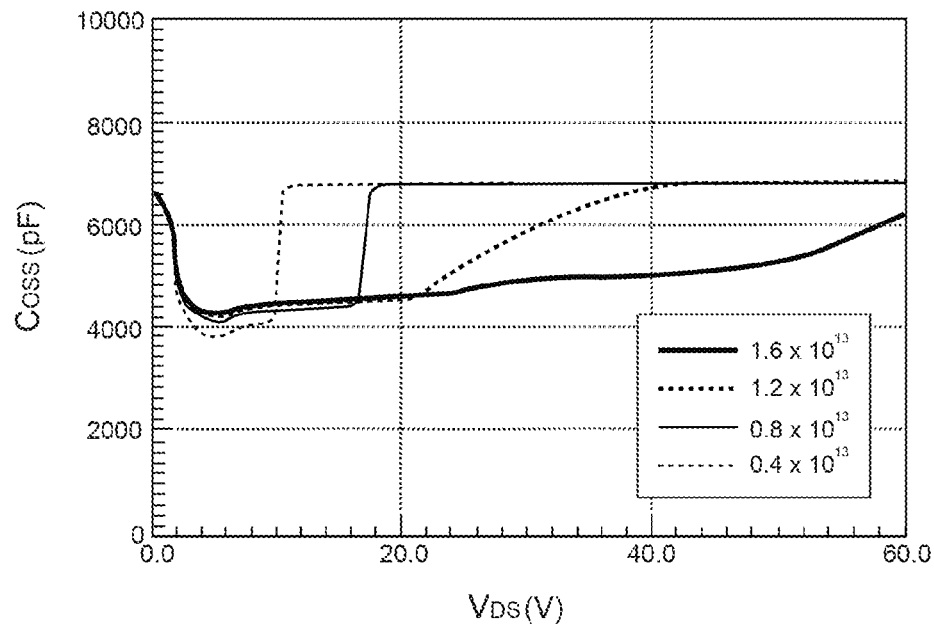
FIG. 25 includes a plot of small-signal $C_{OSS}$ as a function of $V_{DS}$ based on simulations using the circuit in FIG. 24 and different average net dopant concentrations for a compensation region within the charge storage component.
Figure 26:
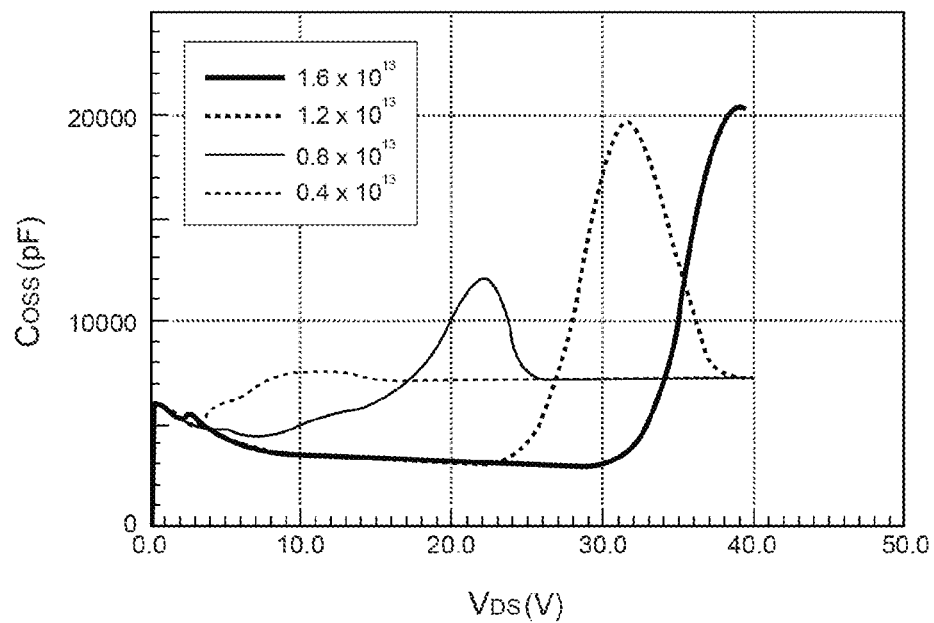
FIG. 26 includes a plot of dynamic $C_{OSS}$ as a function of $V_{DS}$ based on simulations using the circuit in FIG. 24 and different average net dopant concentrations for a compensation region within the charge storage component.

FIGS. 25 and 26 include plots of small-signal $C_{OSS}$ and dynamic $C_{OSS}$ as a function of $V_{DS}$ based on simulations for different implant doses for the barrier doped region 850. The simulations are based on the circuit in FIG. 2 when the component 210 is the pnp bipolar transistor. The dips in the plots for small-signal $C_{OSS}$ in FIG. 25 and the rise in the dynamic $C_{OSS}$ in FIG. 26 demonstrate that the charge storage component exhibits non-linear capacitive behavior when $V_{DS}$ is ramped from 0 V to 30V. As compared to FIGS. 14 and 15, the dips in the plots for small-signal $C_{OSS}$ and the rise in the dynamic $C_{OSS}$ in FIGS. 25 and 26 are similar; however, the increase in small-signal $C_{OSS}$ and the rise in dynamic $C_{OSS}$ occur at higher $V_{DS}$.

Isolation Between Heavily Doped Regions

In a previously described embodiment illustrated in FIG. 8, the body contact regions 1042 and 1236 have the same conductivity type. In a particular embodiment, the body contact regions 1042 and 1236 can both be heavily doped p-type regions. The body contact regions 1042 within the charge storage area 420 may be coupled to the drain terminal 102, and the contact regions 1236 may be coupled to the source terminal 106. A proper design helps to (1) keep leakage current, measured as $I_D$, acceptably low, for example, less than $1 \times 10^{-9}$ A, and (2) allow the drain-to-source breakdown of the transistor 110 to occur at or before leakage current between the body contact regions 1042 and 1236 is greater than $1 \times 10^{-6}$ A. Conventional trench isolation schemes between the transistor 110 and the charge storage component 120, for example, coupling the conductive member 8244 within the isolation trench 572 to the source terminal 106 rather than the drain terminal 102, may have unacceptably high leakage current (greater than $1 \times 10^{-6}$ A) when $V_{DS}$ is 15 V or higher. The conventional trench isolation schemes are not well suited for the transistor 110 that is designed to have $BV_{DS}$ of over 20 V. The configuration described in this paragraph can be used with any of the previously described circuits and physical structures described in conjunction with FIGS. 1 to 25.

The concepts described herein regarding the isolation are not limited to the embodiments as illustrated herein. The isolation designs described and illustrated may be used when an isolation trench is disposed between doped regions of one conductivity type and another doped region of the opposite conductivity type is disposed along a bottom or sidewall of the isolation trench. The combination of a conductive member within the trench and doped regions form a parasitic IGFET, where the conductive member is a gate electrode, the two doped regions be at least part of drain/source regions, and the other doped region (of the opposite conductivity type) includes a channel region of the parasitic IGFET. The conduction path of the parasitic IGFET may pass along the bottom of the isolation trench and through the other doped region that includes the channel region of the parasitic IGFET. Because the isolation design is to substantially prevent the parasitic IGFET from turning on, the voltage of the conductive member, which can be a gate electrode for the parasitic IGFET, dopant concentration of the doped region that includes the channel region of the parasitic IGFET, or both, can be selected to ensure the parasitic IGFET will not turn on during the normal operation of the electronic device.

In an embodiment, the doped region that includes the channel region can lie at the bottom or sidewall of the isolation trench. Any of the doped regions that can be at least part of drain/source regions may lie at the sidewall or be spaced apart from the sidewall of the trench. Any one of the doped regions that can be at least part of drain/source regions may have a lowest elevation that is at a higher elevation as compared to the bottom of the isolation trench. In a particular embodiment, any of the doped regions that can be at least part of drain/source regions can be heavily doped regions. In a more particular embodiment, such doped regions may have a peak dopant concentration of at least $1 \times 10^{19}$ atoms/cm$^3$. In another embodiment, such doped regions may have a peak dopant concentration of at most $5 \times 10^{21}$ atoms/cm$^3$. Such doped regions may form ohmic contacts with conductive plugs or interconnects. In still another embodiment, such doped regions may be adjacent to a primary surface of substrate, semiconductor region, or semiconductor layer. In a further embodiment, the doped region may be more lightly doped or spaced apart from the primary surface 805, for example, the body region 1234.

Turning to FIGS. 1, 3, and 8, the isolation trench 576 is to isolate the charge storage component 120 from the transistor 110. A parasitic IGFET (not illustrated in the circuit diagrams of the figures) is a p-channel IGFET and can include body contact regions 1042 as a source region, the body regions 1234 (channel regions of the transistor 110 in FIG. 1) and/or the body contact regions 1236 as the drain region, a portion of the semiconductor region 804 between the body contact regions 1042 and the body regions 1234 includes the channel region, and the conductive member 8244 within the isolation trench 572 includes the gate electrode of the parasitic IGFET. The body contact region 1042 will be at substantially $V_{DD}$, and the body contact regions 1236 will be at substantially $V_{SS}$.

In one set of embodiments, the conductive member 8244 may be at a voltage sufficiently high enough to repel charge carriers corresponding to the leakage current. Referring to FIG. 8, with respect to the parasitic IGFET, holes can be injected from the body contact regions 1042 of the charge storage component and flow past the isolation trench 572 and into the body regions 1234 and body contact regions 1236. However, to keep the leakage current acceptably low, the conductive member 8244 in the isolation trench 572 is electrically coupled to the same power supply terminal as the body contact regions 1042. In a particular embodiment, the body contact regions 1042 and the conductive member 8244 are electrically coupled to the drain terminal 102, and the body contact regions 1236 are electrically coupled to the source terminal 106. The relatively higher voltage of the conductive member 8244 repels holes. The repulsion helps to keep leakage current acceptably low.

Figure 27:
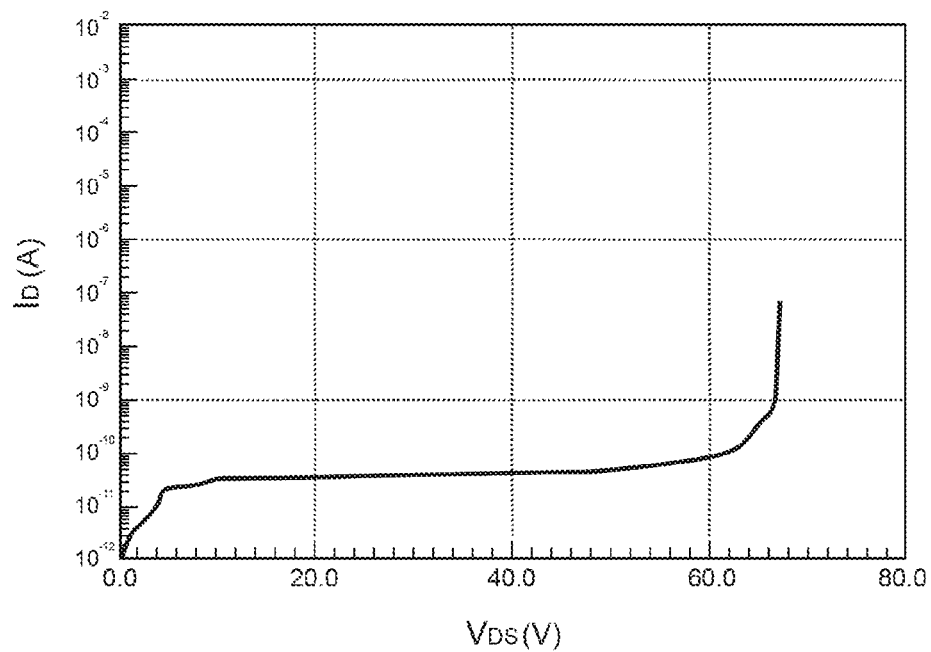
FIG. 27 includes a plot of $I_D$ versus $V_{DS}$ for an embodiment corresponding to the circuit in FIGS. 1 and 3 and the physical design in FIG. 8.

FIG. 27 includes a plot of $I_D$ as a function of $V_{DS}$ based on a simulation using the circuits in FIGS. 1 and 3 and the physical design corresponding to FIG. 8 (T=25° C.). In this embodiment, $BV_{DS}$ for the transistor 110 is approximately 67 V. $I_D$ for the circuit is at most $1 \times 10^{-9}$ A until $V_{DS}$ is above 66 V and is more than $1 \times 10^{-6}$ A when $V_{DS}$ is approximately 67 V. The plot in FIG. 27 demonstrates that the channel region of the parasitic IGFET (corresponding to the isolation trench 572) has not inverted before the drain-to-source breakdown of the transistor 110 has occurred.

In the prior embodiment, the body contact regions 1042 and 1236 are p-type regions. If conductivity types are reversed, leakage current would be associated with electrons. In this embodiment, the conductive member 8244 would be at the relatively lower voltage, such as $V_{SS}$ to help repel electrons from the isolation trench 572 and keep leakage current acceptably low.

Figure 28:
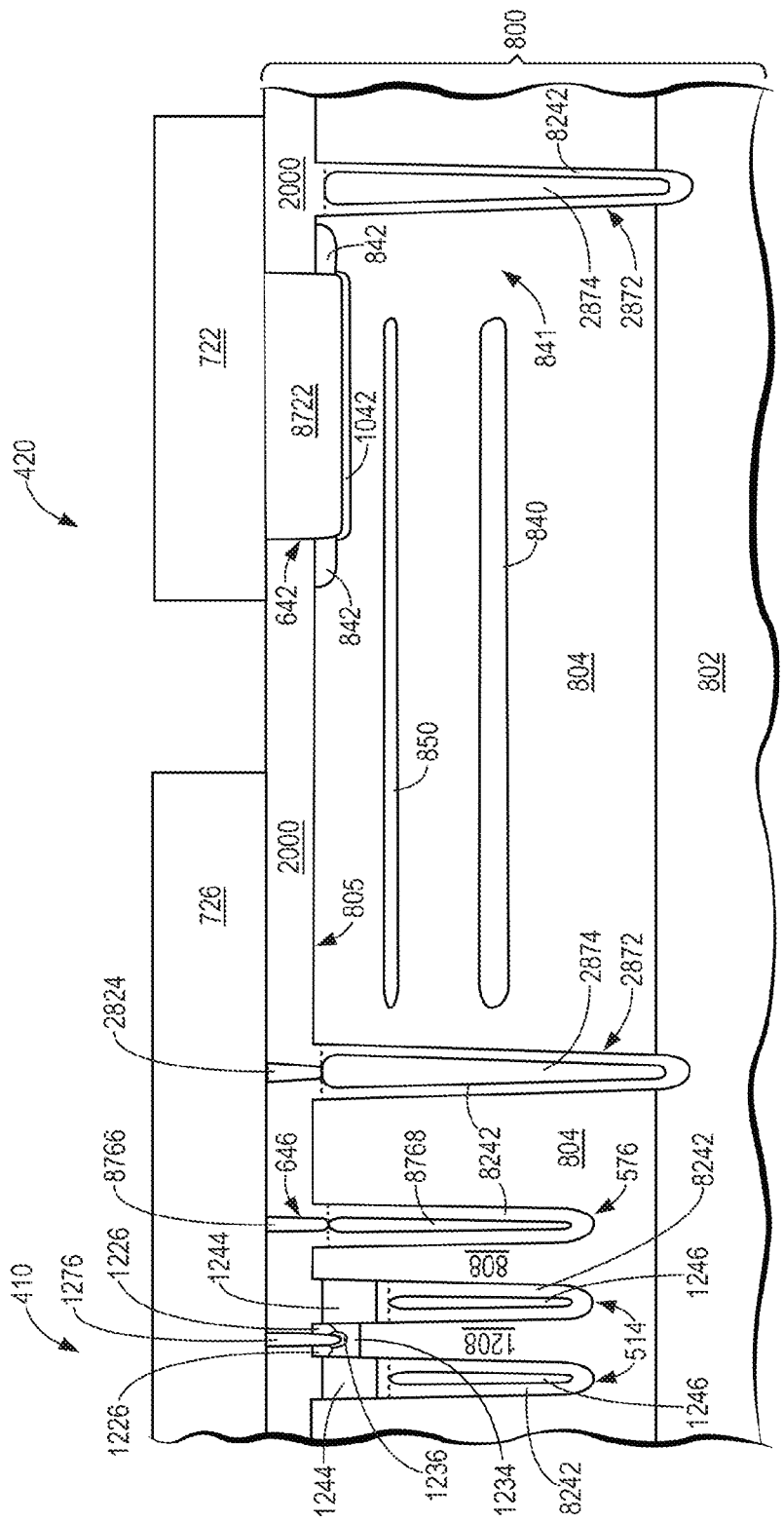
FIG. 28 is similar to FIG. 8 and illustrates a deeper isolation trench.

In another set of embodiments, the isolation trench can be extended, so that the bottom of the isolation trench is closer to or extends into to the buried conductive region 802. This set of embodiments with the extended trench can be used with any of the previously described circuits and physical structures described in conjunction with FIGS. 1 to 25, except for the modifications as described below. FIG. 28 includes a cross-sectional view of an embodiment that is similar to FIG. 8 except an isolation trench 2872 replaces the isolation trench 572, a conductive member 2874 replaces the conductive member 8244, and a conductive plug 2824 replaces the conductive plug 8724. In FIG. 28, the isolation trench 2872 has a bottom that is at an elevation significantly lower than the bottoms of any or all of the trenches 514, 526 (FIG. 9), and 576. The isolation trench 2872 may be adjacent to or extend into the buried conductive region 802. The conductive member 2874 can be formed using any of the materials and techniques as described with respect to the conductive member 8244, and the conductive plug 2824 can be formed using any of the materials and techniques as described with respect to the conductive plug 8724.

Referring briefly to FIG. 6, the contact opening 672 (FIG. 6) is not present in the embodiment illustrated in FIG. 28, and a contact opening (not illustrated) would lie along the horizontal portion of the isolation trench closer to the active area 410. Referring to FIG. 28, the new contact opening includes the conductive plug 2824, and the source interconnect 726 contacts the conductive plug 2824. Thus, the conductive member 2874 within the isolation trench 2872 is coupled to the source terminal 102 via at least the conductive plug 2824 and the source interconnect 726. All other processing operations can be the same as previously described with respect to the previous embodiments.

The dopant concentration at locations at the bottom or along lower portions of the sidewalls of the trench 2872 is greater than the dopant concentration at the bottoms of any or all of the trenches 514, 526 (FIG. 9), and 576 and the background dopant concentration. The relatively higher dopant concentration allows drain-to-source breakdown of the transistor 110 to occur at or before inversion occurs with the parasitic IGFET. The peak dopant concentration in the semiconductor material along the bottom and lower portions of the isolation trench 2872 can be at least $1 \times 10^{18}$ atoms/cm$^3$, $5 \times 10^{18}$ atoms/cm$^3$, or at least $1 \times 10^{19}$ atoms/cm$^3$. In another embodiment, the peak dopant concentration may be at most $5 \times 10^{21}$ atoms/cm$^3$.

Figure 29:
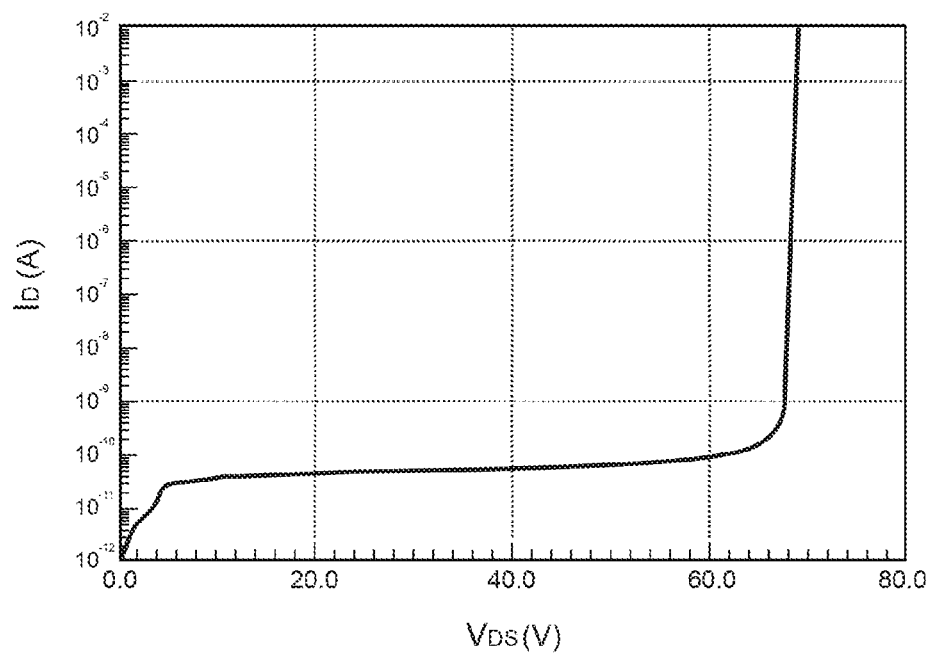
FIG. 29 includes a plot of $I_D$ versus $V_{DS}$ for an embodiment corresponding to the circuits in FIGS. 1 and 3 and the physical design in FIG. 28.

FIG. 29 includes a plot of $I_D$ as a function of $V_{DS}$ based on a simulation using the circuits in FIGS. 1 and 3 and the physical design corresponding to FIG. 28 (T=25° C.). In this embodiment, BV$_{DS}$ for the transistor 110 is approximately 67 V. $I_D$ for the circuit is at most $1 \times 10^{-9}$ A until $V_{DS}$ is above 66 V and is more than $1 \times 10^{-6}$ A when $V_{DS}$ is approximately 67 V. The plot in FIG. 29 demonstrates that the channel region of the parasitic IGFET (corresponding to the isolation trench 2872) has not inverted before the drain-to-source breakdown of the transistor 110 has occurred.

In another embodiment, the conductive member 2874 may be at a voltage between $V_{DD}$ and $V_{SS}$. This embodiment with the intermediate voltage can be used with any of the previously described circuits and physical structures described in conjunction with FIG. 28, except that the conductive member 2874 is coupled to a voltage that is between $V_{DD}$ and $V_{SS}$. As the voltage of the conductive member 2874 becomes closer to $V_{DD}$, the isolation trench 2872 may not need to be as deep. The dopant concentration at the bottom of the isolation trench 2872 will not be as high as compared to the prior embodiment, but the dopant concentration at the bottom of the isolation trench 2872 will still be higher than a dopant concentration at the bottoms of the trenches 514, 526 (FIG. 9), and 576 and the background dopant concentration. Similar to the prior embodiment, the dopant concentration at the bottom of the trench 2872 allows drain-to-source breakdown of the transistor 110 to occur before or at the same time as inversion occurs with the parasitic IGFET that would otherwise provide a conduction path along portions of the isolation trench 2872. Depending on the voltage of the conductive member 2874, the dopant concentration in the semiconductor material along the bottom and lower portions of the isolation trench 2872 can be at least $5 \times 10^{17}$ atoms/cm$^3$ or at least $1 \times 10^{18}$ atoms/cm$^3$.

Figure 30:
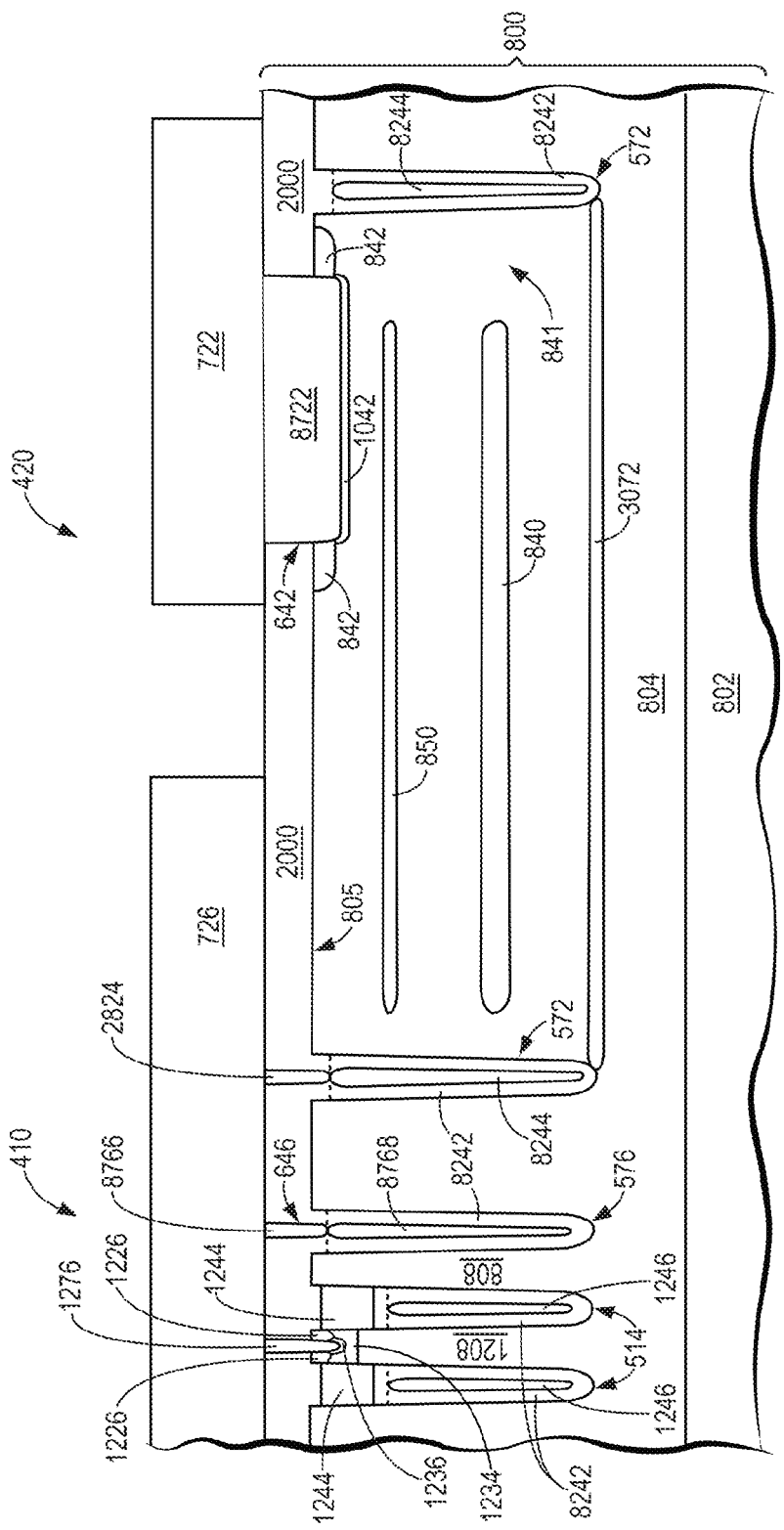
FIG. 30 is similar to FIG. 8 and illustrates locally heavier doping at or near a bottom of the isolation trench.

In still another set of embodiments, another doped region can be used in conjunction with the isolation trench 572. This set of embodiments with the other doped region can be used with any of the previously described circuits and physical structures described in conjunction with FIGS. 1 to 25, except that the conductive member 8244 is coupled to the source interconnect 726. In the embodiment as illustrated in FIG. 30, a doped region 3072 is at or near the bottom of the isolation trench 572. When the compensation region 840 or the barrier doped region 850 is present, the doped region 3072 may underlie part or all of the compensation region 840 or the barrier doped region 850. In FIG. 30, the doped region 3072 does not extend outside the area defined by the isolation trench 572 (where such area can be seen in FIG. 5). In another embodiment (not illustrated), part or all of the doped region 3072 may lie outside the area defined by the isolation trench 572. In a particular embodiment, the doped region 3072 may be closer to active area 410 than illustrated in FIG. 30.

The dopant for the doped region 3072 is opposite the conductivity type of body contact regions 1042 and 1236 and the body region 1234. Similar to the embodiments with the deeper isolation trench 2872 and its conductive member 2844, the conductive member 8244 in the isolation trench 572 is electrically coupled to the source interconnect 726 instead of the drain interconnect 722. The function of the doped region 3072 is the substantially the same as the relatively deeper isolation trench 2872 as illustrated in FIG. 28.

The doped region 3072 allows the dopant concentration at locations at the bottom or along lower portions of the sidewalls of the trench 572 to be greater than the dopant concentration at the bottoms of the trenches 514, 526 (FIG. 9), and 576 and the background dopant concentration. The relatively higher dopant concentration allows drain-to-source breakdown of the transistor 110 to occur at or before inversion occurs with the parasitic IGFET. The peak dopant concentration of the doped region 3072 can be at least $1 \times 10^{18}$ atoms/cm$^3$, $5 \times 10^{18}$ atoms/cm$^3$, or at least $1 \times 10^{19}$ atoms/cm$^3$. In another embodiment, the peak dopant concentration may be at most $5 \times 10^{21}$ atoms/cm$^3$. A plot of $I_D$ as a function of $V_{DS}$ based on a simulation using the circuits in FIGS. 1 and 3 and the physical design corresponding to FIG. 30 is expected to be substantially the same as illustrated in FIG. 29.

In another embodiment, the conductive member 8244 may be at a voltage between $V_{DD}$ and $V_{SS}$. This embodiment with the intermediate voltage can be used with any of the previously described circuits and physical structures described in conjunction with FIG. 30, except that the conductive member 8244 is coupled to a voltage that is between $V_{DD}$ and $V_{SS}$. As the voltage of the conductive member 8244 becomes closer to $V_{DD}$, the peak dopant concentration of the doped region 3072 may not be as high as compared to the prior embodiment, but the peak dopant concentration of the doped region 3072 will still be higher than a dopant concentration at the bottoms of the trenches 514, 526 (FIG. 9), and 576 and the background dopant concentration. Similar to the prior embodiment, the dopant concentration of the doped region 3072 allows drain-to-source breakdown of the transistor 110 to occur before or at the same time when inversion occurs with the parasitic IGFET that would otherwise provide a conduction path along portions of the isolation trench 572. Depending on the voltage of the conductive member 8244, the peak dopant concentration of the doped region 3072 can be at least $5 \times 10^{17}$ atoms/cm$^3$ or at least $1 \times 10^{18}$ atoms/cm$^3$.

Many benefits may be realized with the embodiments described herein. Embodiments as described above include a circuit and physical structure that can help reduce or eliminate ringing that may be caused by an interaction of parasitic inductance in a package of the electronic device and circuit board. In particular, embodiments can help to counteract the non-linear output capacitance of a power transistor, particularly as switching speeds increase and on-state resistance decreases. The design can have a resistance-capacitor structure that provides capacitance-voltage characteristics that are more bi-modal. In an embodiment, the capacitance falls rapidly when the power transistor undergoes a switching transition and then flattens out rapidly to reduce substantially the power transistor from overshooting. Hence, ringing associated with switching is prevented or at least substantially reduced. The new physical structure can be leveraged using an existing process flow without any additional mask or at most only one additional mask.

With respect to isolation, embodiments can help to keep leakage current between two doped regions of the same conductivity type and separated by a trench structure acceptably low. In an embodiment, a conductive member can repel charge carriers associated with the conductivity type of the doped regions. For example, when the doped regions are p-type, the charge carriers are holes, and the conductive member can be at a voltage to repel holes from the trench structure. When the doped regions are n-type, the charge carriers are electrons, and the conductive member can be at a voltage to repel electrons from the trench structure. In another embodiment, a relatively high dopant concentration of semiconductor material at the bottom or sidewall of the trench can be selected to keep leakage current low (at most $1\times10^{-6}$ A or at most $1\times10^{-9}$ A) during the normal operation of the electronic device. The physical structure can be leveraged using an existing process flow without any additional mask or at most only one additional mask.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a substrate including a semiconductor region having a primary surface, wherein the substrate defines a first trench extending at least partly through the semiconductor region; a first conductive member within the first trench; a first doped region having a first conductivity type; a second doped region having the first conductivity type; a semiconductor material having a second conductivity type opposite the first conductivity type, wherein the semiconductor material lies along a bottom or a sidewall of the trench; a first power supply terminal electrically coupled to the first doped region and the first conductive member; and a second power supply terminal electrically coupled to the second doped region. The first trench can be disposed between the first doped region and the second doped region, and at least one of the first doped region and the second doped region lies at an elevation higher than a bottom of the first trench. The electronic device can be configured such that (1) when the first conductivity type is p-type, the first power supply terminal is associated with a higher voltage as compared to the second power supply terminal, or (2) when the first conductivity type is n-type, the first power supply terminal is associated with a lower voltage as compared to the second power supply terminal.

Embodiment 2. The electronic device of Embodiment 1 can further include a first insulating layer within the first trench and disposed between the first conductive member and the semiconductor region.

Embodiment 3. The electronic device of Embodiment 1, wherein the substrate further includes a buried conductive region having the second conductivity type, wherein the buried conductive region underlies the semiconductor region.

Embodiment 4. The electronic device of Embodiment 3, wherein the buried conductive region is electrically coupled to the first power supply terminal.

Embodiment 5. The electronic device of Embodiment 4, wherein a bottom of the first trench is spaced apart from the buried conductive region.

Embodiment 6. The electronic device of Embodiment 4 can further include a second conductive member and a second insulating layer. The substrate further can define a second trench disposed between the first trench and the second doped region, the second conductive member and the second insulating layer can be within the second trench, the second insulating layer can be disposed between the second conductive member and the semiconductor region, and the second conductive member can be coupled to the second power supply terminal.

Embodiment 7. The electronic device of Embodiment 6, wherein a bottom of the second trench is spaced apart from the buried conductive region.

Embodiment 8. The electronic device of Embodiment 4, wherein the second doped region is part of a transistor, and the transistor includes a source region having the second conductivity type, wherein the source region is adjacent to the primary surface and electrically coupled to the second power supply terminal; a body region having the first conductivity type, wherein the body region is adjacent to the source region and electrically coupled to the second power supply terminal; a drift region having the second conductivity type, wherein the drift region is disposed between the body region and the buried conductive region; and a gate electrode coupled to a gate terminal. The substrate can define a second trench extending at least partly through the semiconductor region, the second trench includes the gate electrode, and the drift region is disposed at least partly within a pillar that lies along a sidewall of the second trench.

Embodiment 9. An electronic device can include a substrate including a semiconductor region having a primary surface, wherein the substrate defines a first trench extending at least partly through the semiconductor region, the first trench has a bottom, a first side, and a second side opposite the first side, and the semiconductor region has a background dopant concentration. The electronic device can further include a first doped region having a first conductivity type; a second doped region having the first conductivity type; and a third doped region having the second conductivity type opposite the first conductivity type, wherein the third doped region is adjacent to the bottom, the first side, or the second side of the first trench, and a dopant concentration of the third doped region is at least 2 times the background dopant concentration. The electronic device can still further include a first terminal electrically coupled to the first doped region, wherein the first terminal is associated with a first voltage; and a second terminal electrically coupled to the second doped region, wherein the second terminal is associated with a second voltage that is different from the first voltage. The first trench can be disposed between the first doped region and the second doped region.

Embodiment 10. The electronic device of Embodiment 9, wherein the dopant concentration of the doped region is at least 11 times the background dopant concentration.

Embodiment 11. The electronic device of Embodiment 10 can further include a first conductive member and a first insulating layer, wherein each of the first conductive member and the first insulating layer are within the first trench, the first insulating layer is disposed between the first conductive member and the semiconductor region, and the first conductive member is electrically coupled to the second terminal.

Embodiment 12. The electronic device of Embodiment 11 can further include a second insulating layer and a second conductive member, wherein the substrate further defines a second trench disposed between the first trench and the second doped region, the second conductive member and the second insulating layer are within the second trench, and the second insulating layer is disposed between the second conductive member and the semiconductor region.

Embodiment 13. The electronic device of Embodiment 12, wherein the substrate further includes a buried conductive region having the second conductivity type, the buried conductive region is electrically coupled to the first terminal, the third doped region is a part of the buried conductive region, and a depth of the first trench is greater than a depth of the second trench.

Embodiment 14. The electronic device of Embodiment 12, wherein the substrate further includes a buried conductive region having the second conductivity type, the buried conductive region is electrically coupled to the first terminal, the third doped region is spaced apart from the primary surface and overlies the buried conductive region, and a depth of the first trench is substantially the same as a depth of the second trench.

Embodiment 15. The electronic device of Embodiment 9, wherein the substrate further includes a buried conductive region having the second conductivity type, wherein the buried conductive region is electrically coupled to the first terminal, the substrate defines a second trench extending at least partly through the semiconductor region, and the second doped region is part of a transistor. The transistor can include a source region having the second conductivity type, wherein the source region is adjacent to the primary surface and electrically coupled to the second terminal; a body region having the first conductivity type, wherein the body region is adjacent to the source region and electrically coupled to the second terminal; a drift region having the second conductivity type; and a gate electrode within the second trench and coupled to a gate terminal. The drift region can be at least partly within a pillar that lies along a sidewall of the second trench and disposed between the body region and the buried conductive region; and Embodiment 16. The electronic device of Embodiment 15 can further include a shield electrode within the second trench and disposed below the gate electrode, wherein the shield electrode is electrically coupled to the second terminal.

Embodiment 17. The electronic device of Embodiment 15, wherein the first terminal is a drain terminal, and the second terminal is a source terminal.

Embodiment 18. An electronic device can include a parasitic insulated-gate field-effect transistor. The parasitic insulated-gate field-effect transistor can include a substrate including a semiconductor region having a primary surface, wherein the substrate defines a first trench extending at least partly through the semiconductor region, and the first trench has a bottom, a first side, and a second side opposite the first side. The parasitic insulated-gate field-effect transistor can further include a source region that is closer to the first side of the first trench than to the second side of the first trench, wherein the source region has a first conductivity type; a drain region that is closer to the second side of the first trench than to the first side of the first trench, wherein the drain region has the first conductivity type; a channel region disposed at the bottom, the first side, or the second side of the first trench, wherein the channel region has a second conductivity type opposite the first conductivity type; a gate electrode disposed within the first trench; a first terminal electrically coupled to the source region, wherein the first terminal is associated with a first voltage; and a second terminal electrically coupled to the drain region, wherein the second terminal is associated with a second voltage that is different from the first voltage. The first trench can be disposed between the source region and the drain region, and a dopant concentration of the channel region can be sufficient to prevent inversion of the channel region during normal operation of the electronic device.

Embodiment 19. The electronic device of Embodiment 18, wherein the first conductive member is electrically coupled to the second terminal.

Embodiment 20. The electronic device of Embodiment 18, wherein the drain region of the parasitic insulated-gate field-effect transistor is part of another transistor, and the electronic device is configured such that an absolute value of a drain-to-source breakdown voltage of the other transistor occurs before inversion of the channel region of the parasitic insulated-gate field-effect transistor.

Embodiment 21. An electronic device can include a substrate including a buried conductive region and a semiconductor region overlying the buried conductive region. The buried conductive region can have a first conductivity type, the semiconductor region can have a primary surface, and the substrate can define a first trench that extends at least partly through the semiconductor region, wherein a portion of the substrate adjacent to the first trench includes a first pillar. The electronic device can also include a first doped region within the first pillar and adjacent to the primary surface, wherein the first doped region has a second conductivity type opposite the first conductivity type, and the first doped region is electrically coupled to the buried conductive region. The electronic device can further include a first conductive member within the first trench and adjacent to the first pillar. A charge storage component can include a first electrode and a second electrode, the first electrode includes the first pillar, and the second electrode includes the first conductive member.

Embodiment 22. The electronic device of Embodiment 21 can further include a second doped region overlying the buried conductive region and adjacent to the primary surface, wherein the second doped region has the first conductivity type; and a second conductive member is in contact with the first doped region and the second doped region. The buried conductive region can be electrically coupled to the first doped region via at least the second conductive member and a portion of the semiconductor region disposed between the buried conductive region and the second doped region.

Embodiment 23. The electronic device of Embodiment 21 can further include a compensation region within the first pillar and spaced apart from the buried conductive region by a first part of the first pillar and from the primary surface by a second part of the first pillar. An average net dopant concentration of the compensation region can be less than each of an average dopant concentration of the first part of the first pillar and an average dopant concentration of the second part of the first pillar.

Embodiment 24. The electronic device of Embodiment 23, wherein a gap is disposed between the compensation region and the first trench, and the gap is along a conduction path between the buried conductive region and first doped region.

Embodiment 25. The electronic device of Embodiment 21 can further include a barrier doped region within the first pillar and spaced apart from the primary surface. The barrier doped region can have the first conductivity type, a portion of the first pillar can be disposed between the barrier doped region and the buried conductive region, the portion of the first pillar can have the first conductivity type, and an average dopant concentration of the barrier doped region can be greater than an average dopant concentration of the portion of the first pillar.

Embodiment 26. The electronic device of Embodiment 21 can further include a first power supply terminal, a second power supply terminal, and a control terminal; and a transistor having a current-carrying region and a control electrode. The current-carrying region can be within a second pillar and adjacent to the primary surface, wherein the second pillar can be spaced apart from the first pillar, the first power supply terminal can be electrically coupled to the buried conductive region, the second power supply terminal can be electrically coupled to the current-carrying region and the first conductive member, and the control terminal can be electrically coupled to the control electrode of the transistor.

Embodiment 27. The electronic device of Embodiment 26, wherein the substrate defines an isolation trench spaced apart from the first trench, wherein the isolation trench is disposed between the charge storage component and the transistor.

Embodiment 28. The electronic device of Embodiment 27, wherein the transistor includes a doped region having the second conductivity type, wherein the isolation trench electrically isolates the doped region of the transistor from the first doped region within the first pillar.

Embodiment 29. The electronic device of Embodiment 21 can further include a second doped region overlying the buried conductive region and adjacent to the primary surface, wherein the second doped region has the first conductivity type, and the second doped region is electrically coupled to the buried conductive region; a second conductive member is in contact with the first doped region and the second doped region; a compensation region within the first pillar and spaced apart from the buried conductive region by a first part of the first pillar and from the primary surface by a second part of the first pillar; a barrier doped region having the first conductivity type, being within the first pillar, and being spaced apart from the primary surface; a first power supply terminal, a second power supply terminal, and a control terminal; and a transistor having a current-carrying region and a control electrode.

The substrate can define an isolation trench spaced apart from the first trench, wherein the isolation trench is disposed between the charge storage component and the transistor. The buried conductive region can be electrically coupled to the first doped region via at least the second conductive member and a portion of the semiconductor region disposed between the buried conductive region and the second doped region. An average net dopant concentration of the compensation region can be less than each of an average dopant concentration of the first part of the first pillar and an average dopant concentration of the second part of the first pillar, and an average dopant concentration of the barrier doped region can be greater than an average dopant concentration of the first part of the first pillar. The current-carrying region of the transistor can be within a second pillar spaced apart from the first pillar, the current-carrying region of the transistor can be the adjacent to the primary surface, the first power supply terminal can be electrically coupled to the buried conductive region, the second power supply terminal can be electrically coupled to the current-carrying region of the transistor and the first conductive member, and the control terminal can be electrically coupled to the control electrode of the transistor.

Embodiment 30. An electronic device can include a substrate including a buried conductive region and a semiconductor region overlying the buried conductive region, wherein the buried conductive region has a first conductivity type, and the semiconductor region has a primary surface. The electronic device can further include a first doped region overlying the buried conductive region and adjacent to the primary surface, wherein the first doped region has a second conductivity type opposite the first conductivity type; a second doped region overlying the buried conductive region and adjacent to the primary surface, wherein the second doped region has the first conductivity type; and a first conductive member in contact with the first doped region and the second doped region. The buried conductive region can be electrically coupled to the first doped region via at least a portion of the semiconductor region disposed between the buried conductive region and the second doped region.

Embodiment 31. The electronic device of Embodiment 30 can further include a compensation region spaced apart from the buried conductive region by a first part of the semiconductor region and from the primary surface by a second part of the semiconductor region, wherein an average net dopant concentration of the compensation region is less than each of an average dopant concentration of the first part of the semiconductor region and an average dopant concentration of the second part of the semiconductor region.

Embodiment 32. The electronic device of Embodiment 31, wherein a gap is outside the compensation region and disposed within at least a portion of the semiconductor region between the buried conductive region and the second doped region, wherein the gap corresponds to an electrical coupling between the buried doped region and the second doped region.

Embodiment 33. The electronic device of Embodiment 31 can further include a second conductive member. The substrate can define a trench that extends at least partly through the semiconductor region, wherein a portion of the substrate adjacent to the trench includes a pillar, each of the first doped region and the second doped region can be within the pillar, the second conductive member can be disposed within the trench and adjacent to the pillar, and a charge storage component can include a first electrode and a second electrode, the first electrode includes the pillar, and the second electrode includes the second conductive member.

Embodiment 34. The electronic device of Embodiment 30 can further include a barrier doped region having the first conductivity type. A pillar can include the first doped region, the second doped region, and the barrier doped region, wherein the barrier doped region is adjacent to the first doped region. A portion of the pillar can be disposed between the barrier doped region and the buried conductive region, the portion of the pillar can have the first conductivity type, and an average dopant concentration of the barrier doped region can be greater than an average dopant concentration of the portion of the pillar.

Embodiment 35. The electronic device of Embodiment 30 can further include a second conductive member. The substrate can define a first trench that extends at least partly through the semiconductor region, wherein a portion of the substrate adjacent to the first trench includes a first pillar. The second conductive member can be within the first trench and adjacent to the first pillar. A charge storage component can include a first electrode and a second electrode, the first electrode includes the first pillar, and the second electrode includes the second conductive member.

Embodiment 36. The electronic device of any one of Embodiments 21, 22, 30, and 35 can further include a compensation region spaced apart from the buried conductive region by a first part of the semiconductor region and from the primary surface by a second part of the semiconductor region. An average net dopant concentration of the compensation region can be less than each of an average dopant concentration of the first part of the semiconductor region and an average dopant concentration of the second part of the semiconductor region.

Embodiment 37. An electronic device can include a substrate including a buried conductive region and a semiconductor region overlying the buried conductive region, wherein the buried conductive region has a first conductivity type, the semiconductor region has a primary surface, and the substrate defines a first trench that extends at least partly through the semiconductor region, wherein a portion of the substrate adjacent to the trench includes a first pillar. The electronic device can further include a compensation region within the first pillar and spaced apart from the buried conductive region by a first part of the first pillar and from the primary surface by a second part of the first pillar; and a first conductive member within the trench and adjacent to the first pillar. An average net dopant concentration of the compensation region can be less than each of an average dopant concentration of the first part of the first pillar and an average dopant concentration of the second part of the first pillar, and a charge storage component can include a first electrode and a second electrode, the first electrode includes the first pillar, and the second electrode includes the first conductive member.

Embodiment 38. The electronic device of Embodiment 37, wherein a gap is disposed between the compensation region and the first trench, and the gap is along a conduction path between the buried conductive region and a portion of the first pillar at an elevation higher than an elevation of compensation region.

Embodiment 39. The electronic device of Embodiment 37, further includes a barrier doped region within the first pillar and spaced apart from the primary surface, wherein the barrier doped region has the first conductivity type, the second part of the first pillar has the first conductivity type, and an average dopant concentration of the barrier doped region is greater than an average dopant concentration of the second part of the first pillar.

Embodiment 40. The electronic device of Embodiment 37 can further include a first power supply terminal, a second power supply terminal, and a control terminal; and a transistor having a current-carrying region and a control electrode. The current-carrying region can be within a second pillar spaced apart from the first pillar, the current-carrying region can be the adjacent to the primary surface, the first power supply terminal can be electrically coupled to the buried conductive region, the second power supply terminal can be electrically coupled to the current-carrying region of the transistor and the first conductive member, and the control terminal can be electrically coupled to the control electrode of the transistor.

Embodiment 41. The electronic device of Embodiment 40, wherein the substrate defines an isolation trench spaced apart from the first trench, wherein the isolation trench is disposed between the charge storage component and the transistor.

Embodiment 42. The electronic device of Embodiment 41, wherein the charge storage component includes a first doped region within the first pillar and adjacent to the primary surface, the first doped region of the charge storage component has a second conductivity type opposite the first conductivity type, the transistor includes a second doped region having the second conductivity type, and the isolation trench electrically isolates the second doped region of the transistor from the first doped region of the charge storage component.

Embodiment 43. The electronic device of any one of Embodiments 21, 22, 30, and 35 to 37 can further include a barrier doped region within the semiconductor region and spaced apart from the primary surface. The barrier doped region can have the first conductivity type, a portion of the semiconductor region can be disposed between the barrier doped region and the buried conductive region, the portion of the semiconductor region can have the first conductivity type, and an average dopant concentration of the barrier doped region can be greater than an average dopant concentration of the portion of the semiconductor region.

Embodiment 44. An electronic device can include a substrate including a buried conductive region and a semiconductor region overlying the buried conductive region, wherein the buried conductive region, the semiconductor region has a primary surface, and the substrate defines a first trench that extends at least partly through the semiconductor region, wherein a portion of the substrate adjacent to the first trench includes a first pillar. The electronic device can further include a barrier doped region within the first pillar and spaced apart from the buried conductive region by a first part of the first pillar and from the primary surface by a second part of the first pillar; and a first conductive member within the first trench and adjacent to the first pillar. An average dopant concentration of the barrier doped region can be greater than an average dopant concentration of the first part of the first pillar or an average dopant concentration of the second part of the first pillar, a charge storage component can include a first electrode and a second electrode, the first electrode includes the first pillar, and the second electrode includes the first conductive member.

Embodiment 45. The electronic device of any one of Embodiments 21, 22, 35 to 37, 43, and 44 can further include a first power supply terminal, a second power supply terminal, and a control terminal; and a transistor having a current-carrying region and a control electrode. The current-carrying region can be the adjacent to the primary surface, the first power supply terminal can be electrically coupled to the buried conductive region, the second power supply terminal can be electrically coupled to the current-carrying region of the transistor and the second electrode of the charge storage component, and the control terminal can be electrically coupled to the control electrode of the transistor.

Embodiment 46. The electronic device of Embodiment 45, wherein the substrate defines an isolation trench, wherein the isolation trench is disposed between the charge storage component and the transistor.

Embodiment 47. An electronic device can include a first component including a pn junction with a junction between a p-type region and an n-type region; a charge storage element having a first electrode and a second electrode; and a transistor including a first current-carrying electrode, a second current-carrying electrode, and a control electrode. One of the p-type region of the pn junction and the n-type region of the pn junction can be electrically coupled to the second current-carrying electrode of the transistor, the other of the p-type region of the pn junction and the n-type region of the pn junction can be electrically coupled to the first electrode of the charge storage element and the first current-carrying electrode of the transistor, and the second electrode of the charge storage element can be electrically coupled to the control electrode of the transistor.

Embodiment 48. An electronic device can includes a first transistor including a first current-carrying electrode, a second current-carrying electrode, and a control electrode, wherein the first transistor corresponds to a first charged carrier type; and a second transistor including a first current-carrying electrode, a second current-carrying electrode, and a control electrode, wherein the second transistor corresponds to a second charged carrier type opposite the first charged carrier type. The first current-carrying electrode of the first transistor can be electrically coupled to the second current-carrying electrode of the second transistor, the second current-carrying electrode of the first transistor can be electrically coupled to the first current-carrying electrode of the second transistor, and the control electrode of the first transistor can be electrically coupled to the control electrode of the second transistor.

Embodiment 49. The electronic device of Embodiment 48, wherein the first transistor is a p-channel insulated-gate field-effect transistor or a pnp bipolar transistor, and the second transistor is an n-channel insulated-gate field-effect transistor.

Embodiment 50. The electronic device of Embodiment 49 can further include a third transistor that is the other of the p-channel insulated-gate field-effect transistor and the pnp bipolar transistor.

Embodiment 51. The electronic device of any one of Embodiments 48 to 50 can further include a first power supply terminal, a second supply power terminal, a control terminal, and a power transistor. The power transistor can include a first current-carrying electrode, a second current-carrying electrode, and a control electrode, the first power supply terminal can be electrically coupled to the first current-carrying electrode of the power transistor, the first current-carrying electrode of the first transistor, and the second current-carrying electrode of the second transistor, the second power supply terminal can be electrically coupled to the second current-carrying electrode of the power transistor, the control electrode of the first transistor, and the control electrode of the second transistor, and the control terminal can be electrically coupled to the control electrode of the power transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
    a substrate including a semiconductor region having a primary surface, wherein the substrate defines a first trench extending at least partly through the semiconductor region;
    a first conductive member within the first trench;
    a first insulating layer disposed between the first conductive member and a sidewall of the first trench;
    a first doped region having a first conductivity type, wherein the first doped region is adjacent to the first trench;
    a semiconductor material having a second conductivity type opposite the first conductivity type, wherein the semiconductor material lies along a bottom or the sidewall of the first trench;
    a transistor having a body region, wherein:
        the body region has the first conductivity type,
        the body region is spaced apart from the first doped region, and
        the body region is adjacent to the primary surface;
    a first power supply terminal electrically coupled to the first doped region and the first conductive member; and
    a second power supply terminal electrically coupled to the body region,
    wherein:
        the first trench is disposed between the first doped region and the body region,
        at least one of the first doped region and the body region lies at an elevation higher than the bottom of the first trench, and
        within the electronic device:
            (1) the first conductivity type is p-type, and the first power supply terminal is associated with a higher voltage as compared to the second power supply terminal, or
            (2) the first conductivity type is n-type, and the first power supply terminal is associated with a lower voltage as compared to the second power supply terminal.

2. The electronic device of claim 1, further comprising a first insulating layer within the first trench and disposed between the first conductive member and the semiconductor region.

3. The electronic device of claim 1, wherein the substrate further comprises a buried conductive region having the second conductivity type, wherein the buried conductive region underlies the semiconductor region, and the buried conductive region is electrically coupled to the first power supply terminal.

4. The electronic device of claim 3, wherein the bottom of the first trench is spaced apart from the buried conductive region.

5. The electronic device of claim 3, further comprising a second conductive member and a second insulating layer, wherein:
    the substrate further defines a second trench disposed between the first trench and the body region,
    the second conductive member and the second insulating layer are within the second trench,
    the second insulating layer is disposed between the second conductive member and the semiconductor region, and the second conductive member is coupled to the second power supply terminal.

6. The electronic device of claim 5, wherein a bottom of the second trench is spaced apart from the buried conductive region.

7. The electronic device of claim 1, further comprising:
a source region of the transistor having the second conductivity type, wherein the source region is adjacent to the primary surface, and the source region is electrically coupled to the second power supply terminal;
a buried conductive region having the second conductivity type, wherein the buried conductive region underlies the first doped region and the body region, and the buried conductive region is electrically coupled to the first power supply terminal;
a drift region having the second conductivity type, wherein the drift region is disposed between the body region and the buried conductive region; and
a gate electrode of the transistor coupled to a gate terminal,
wherein the substrate defines a second trench extending at least partly through the semiconductor region, the second trench includes the gate electrode, and the drift region is disposed at least partly within a pillar that lies along a sidewall of the second trench.

8. An electronic device comprising:
a substrate including a buried conductive region and a semiconductor region overlying the buried conductive region, wherein:
the buried conductive region has a first conductivity type,
the semiconductor region has a primary surface,
the substrate defines a first trench that extends at least partly through the semiconductor region, and
a portion of the substrate adjacent to the first trench includes a first pillar;
a first doped region within the first pillar and adjacent to the primary surface, wherein the first doped region has a second conductivity type opposite the first conductivity type;
a compensation region within the first pillar and spaced apart from the buried conductive region by a first part of the first pillar and from the primary surface by a second part of the first pillar, wherein an average net dopant concentration of the compensation region is less than each of an average dopant concentration of the first part of the first pillar and an average dopant concentration of the second part of the first pillar;
a first conductive member within the first trench and adjacent to the first pillar; and
a charge storage component including a first electrode and a second electrode, the first electrode includes the first pillar, and the second electrode includes the first conductive member.

9. The electronic device of claim 8, further comprising:
a second doped region overlying the buried conductive region and adjacent to the primary surface, wherein the second doped region has the first conductivity type; and
a second conductive member in contact with the first doped region and the second doped region,
wherein the buried conductive region is electrically coupled to the first doped region via at least the second conductive member and a portion of the semiconductor region disposed between the buried conductive region and the second doped region.

10. The electronic device of claim 8, wherein a gap is disposed between the compensation region and the first trench, and the gap is along a conduction path between the buried conductive region and the first doped region.

11. The electronic device of claim 8, further comprising a barrier doped region within the first pillar and spaced apart from the primary surface, wherein:
the barrier doped region has the first conductivity type,
a portion of the first pillar is disposed between the barrier doped region and the buried conductive region, the portion of the first pillar has the first conductivity type, and
an average dopant concentration of the barrier doped region is greater than an average dopant concentration of the portion of the first pillar.

12. The electronic device of claim 8, further comprising:
a first power supply terminal, a second power supply terminal, and a control terminal; and
a transistor having a current-carrying region and a control electrode,
wherein:
the current-carrying region is within a second pillar and adjacent to the primary surface, and the second pillar is spaced apart from the first pillar,
the first power supply terminal is electrically coupled to the buried conductive region,
the second power supply terminal is electrically coupled to the current-carrying region, and
the control terminal is electrically coupled to the control electrode of the transistor.

13. The electronic device of claim 12, wherein the substrate defines an isolation trench spaced apart from the first trench, wherein the isolation trench is disposed between the charge storage component and the transistor.

14. The electronic device of claim 8, further comprising:
a second doped region overlying the buried conductive region and adjacent to the primary surface, wherein the second doped region has the first conductivity type, and the second doped region is electrically coupled to the buried conductive region;
a second conductive member is in contact with the first doped region and the second doped region;
a compensation region within the first pillar and spaced apart from the buried conductive region by a first part of the first pillar and from the primary surface by a second part of the first pillar;
a barrier doped region having the first conductivity type, wherein the barrier doped region is within the first pillar and spaced apart from the primary surface;
a first power supply terminal, a second power supply terminal, and a control terminal; and
a transistor having a current-carrying region and a control electrode,
wherein:
the substrate defines an isolation trench spaced apart from the first trench, wherein the isolation trench is disposed between the charge storage component and the transistor,
the buried conductive region is electrically coupled to the first doped region via at least the second conductive member and a portion of the semiconductor region disposed between the buried conductive region and the second doped region,
an average net dopant concentration of the compensation region is less than each of an average dopant concentration of the first part of the first pillar and an average dopant concentration of the second part of the first pillar, an average dopant concentration of the barrier doped region is greater than the average dopant concentration of the first part of the first pillar, the current-carrying region of the transistor is within a second pillar, wherein the second pillar is spaced apart from the first pillar, the current-carrying region of the transistor is adjacent to the primary surface, the first power supply terminal is electrically coupled to the buried conductive region, the second power supply terminal is electrically coupled to the current-carrying region of the transistor, and the control terminal is electrically coupled to the control electrode of the transistor.

15. An electronic device comprising:
a substrate including a buried conductive region and a semiconductor region overlying the buried conductive region, wherein the buried conductive region has a first conductivity type, and the semiconductor region has a primary surface;
a charge storage component comprising:
  a first doped region overlying the buried conductive region and adjacent to the primary surface, wherein the first doped region has a second conductivity type opposite the first conductivity type;
  a second doped region overlying the buried conductive region and adjacent to the primary surface, wherein the second doped region has the first conductivity type; and
  a first conductive member in contact with the first doped region and the second doped region;
a transistor having a source region, and a body region, wherein:
  the source region has the first conductivity type,
  the body region has the second conductivity type, and
  the source region overlies the body region that overlies the buried conductive region;
a first power supply terminal electrically coupled to the first doped region, the second doped region, the first conductive member and the buried conductive region; and
a second power supply terminal electrically coupled to the source region, the body region, and a terminal of the charge storage component, wherein the buried conductive region is electrically coupled to the first doped region via at least a portion of the semiconductor region disposed between the buried conductive region and the second doped region.

16. The electronic device of claim 15, further comprising a compensation region spaced apart from the buried conductive region by a first part of the semiconductor region and from the primary surface by a second part of the semiconductor region, wherein an average net dopant concentration of the compensation region is less than each of an average dopant concentration of the first part of the semiconductor region and an average dopant concentration of the second part of the semiconductor region.

17. The electronic device of claim 16, wherein a gap is outside the compensation region and disposed within at least a portion of the semiconductor region between the buried conductive region and the second doped region, wherein the gap corresponds to an electrical coupling between the buried conductive region and the second doped region.

18. The electronic device of claim 16, further comprising a second conductive member, wherein:
  the substrate defines a trench that extends at least partly through the semiconductor region, wherein a portion of the substrate adjacent to the trench includes a pillar,
  each of the first doped region and the second doped region is within the pillar, and
  the second conductive member is within the trench and adjacent to the pillar.

19. The electronic device of claim 15, further comprising a second conductive member, wherein:
  the substrate defines a first trench that extends at least partly through the semiconductor region, wherein a portion of the substrate adjacent to the first trench includes a first pillar,
  the second conductive member is within the first trench and adjacent to the first pillar, and
  a charge storage component includes a first electrode and a second electrode, the first electrode includes the first pillar, and the second electrode includes the second conductive member.

20. The electronic device of claim 15, wherein the charge storage component is within a charge storage area, and the transistor is outside the charge storage area.

* * * * *